(12) United States Patent
Park et al.

(10) Patent No.: US 11,075,709 B2
(45) Date of Patent: Jul. 27, 2021

(54) VARIABLE SPREADING FACTOR CODES FOR NON-ORTHOGONAL MULTIPLE ACCESS

(71) Applicant: QUALCOMM Incorporated, San Diego, CA (US)

(72) Inventors: Seyong Park, San Diego, CA (US); Jing Lei, San Diego, CA (US); Renqiu Wang, San Diego, CA (US); Joseph Binamira Soriaga, San Diego, CA (US); Naga Bhushan, San Diego, CA (US); Tingfang Ji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 217 days.

(21) Appl. No.: 16/274,307

(22) Filed: Feb. 13, 2019

(65) Prior Publication Data

US 2019/0253172 A1 Aug. 15, 2019

Related U.S. Application Data

(60) Provisional application No. 62/631,481, filed on Feb. 15, 2018.

(51) Int. Cl.
*H04J 13/00* (2011.01)
*H04J 13/20* (2011.01)
(Continued)

(52) U.S. Cl.
CPC ....... *H04J 13/0044* (2013.01); *H03M 7/3088* (2013.01); *H04J 11/004* (2013.01);
(Continued)

(58) Field of Classification Search
CPC ...... H04J 13/0044; H04J 11/004; H04J 13/20; H04J 13/22; H04J 13/14; H04J 2211/005;
(Continued)

(56) References Cited

U.S. PATENT DOCUMENTS

2010/0046492 A1* 2/2010 Abraham ............. H04W 56/00
370/342
2018/0054219 A1* 2/2018 Qian ................. H03M 13/6561
(Continued)

FOREIGN PATENT DOCUMENTS

WO WO-2017057834 A1 4/2017
WO WO-2018021592 A1 2/2018

OTHER PUBLICATIONS

International Search Report and Written Opinion—PCT/US2019/018037—ISA/EPO—dated May 22, 2019.
(Continued)

*Primary Examiner* — Walter J Divito
(74) *Attorney, Agent, or Firm* — Qualcomm Incorporated

(57) ABSTRACT

Aspects of the present disclosure provide techniques for variable spreading factor codes for non-orthogonal multiple access (NOMA). In an exemplary method, a base station assigns, from a first codebook of N short code sequences of length K, a subset of the short code sequences to a number of user equipments (UEs); receives a signal including uplink data or control signals from two or more of the UEs, wherein a first uplink data or control signal is sent using a first subsequence of one of the assigned short code sequences, and a second uplink data or control signal is sent using a second subsequence of one of the assigned short code sequences or using one of the assigned short code sequences; and decodes each uplink data or control signal in the signal based on the assigned short code sequences and subsequences of the assigned the short code sequences.

28 Claims, 20 Drawing Sheets

(51) Int. Cl.
  *H03M 7/30* (2006.01)
  *H04J 13/22* (2011.01)
  *H04J 13/14* (2011.01)
  *H04L 1/00* (2006.01)
  *H04L 5/00* (2006.01)
  *H04J 11/00* (2006.01)

(52) U.S. Cl.
  CPC .............. *H04J 13/14* (2013.01); *H04J 13/20* (2013.01); *H04J 13/22* (2013.01); *H04L 1/0041* (2013.01); *H04L 1/0045* (2013.01); *H04L 5/0021* (2013.01); *H04L 5/0026* (2013.01); *H04L 5/0053* (2013.01); *H04J 2211/005* (2013.01)

(58) Field of Classification Search
  CPC ... H04L 1/0041; H04L 1/0045; H04L 5/0021; H04L 5/0026; H04L 5/0053; H03M 7/3088
  See application file for complete search history.

(56) References Cited

U.S. PATENT DOCUMENTS

2018/0249452 A1   8/2018   Lee et al.
2019/0165972 A1*  5/2019   Lee ........................ H04J 11/004

OTHER PUBLICATIONS

Qualcomm Incorporated: "Transmitter Side Signal Processing Schemes for NOMA", 3GPP TSG-RAN WG1 Meeting #92bis, 3GPP Draft; R1-1804823 Transmitter Side Signal Processing Schemes for Noma, 3rd Generation Partnership Project (3GPP), Mobile Competence Centre; 650, Route Des Lucioles; F-06921 Sophia-Antipolis Cedex, vol. RAN WG1, No. Sanya, China; Apr. 26, 2018-Apr. 20, 2018, Apr. 7, 2018, 8 Pages, XP051414178, Retrieved from the Internet: URL: http://www.3gpp.org/ftp/tsg%5Fran/WG1%5FRL1/TSGR1%5F92B/Docs/ [retrieved on Apr. 7, 2018] figure 3.

Qualcomm Incorporated: "RSMA and SCMA Comparison", 3GPP TSG-RAN WG1 #86, 3GPP Draft; R1-166358 RSMA and SCMA Comparison, 3rd Generation Partnership Project (3GPP), Mobile Competence Centre; 650, Route Des Lucioles; F-06921 Sophia-Antipolis Cedex; France, vol. RAN WG1, No. Gothenburg, Sweden; Aug. 22, 2016-Aug. 26, 2016, Aug. 21, 2016 (Aug. 21, 2016), pp. 1-11, XP051125349, Retrieved from the Internet: URL: http://www.3gpp.org/ftp/Meetings_3GPP_SYNC/RAN1/Docs/ [retrieved on Aug. 21, 2016] Figure 5.

* cited by examiner

VARIABLE SPREADING FACTOR CODES FOR NON-ORTHOGONAL MULTIPLE ACCESS

CROSS-REFERENCE TO RELATED APPLICATIONS

The present Application for patent claims benefit of and priority to U.S. Provisional Patent Application No. 62/631,481, filed Feb. 15, 2018, which is assigned to the assignee hereof and hereby expressly incorporated by reference herein in its entirety as if fully set forth below and for all applicable purposes.

FIELD

The present disclosure relates generally to wireless communication systems, and more particularly, to techniques for variable spreading factor codes for non-orthogonal multiple access (NOMA), which may be useful in communications systems operating according to fifth generation (5G) or new radio (NR) standards.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an eNodeB (eNB). In other examples (e.g., in a next generation or $5^{th}$ generation (5G) network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, eNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a desire for further improvements in NR technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure provide a method for wireless communications by a base station (BS). The method generally includes assigning, from a first codebook of N short code sequences of length K, a subset of the short code sequences to a number of user equipments (UEs), wherein the number is at least two and at most N; receiving a signal including uplink data or control signals from two or more of the UEs, wherein: a first uplink data or control signal is sent using a first subsequence of one of the assigned subset of short code sequences, and a second uplink data or control signal, different from the first uplink data or control signal, is sent using a second subsequence of one of the assigned subset of short code sequences or using one of the assigned subset of short code sequences; and decoding each uplink data or control signal in the signal based on the assigned subset of the short code sequences and subsequences of the short code sequences in the assigned subset of the short code sequences.

Certain aspects of the present disclosure provide a method for wireless communications by a user equipment (UE). The method generally includes obtaining a first codebook of N short code sequences of length K; receiving, from a base station (BS), an assignment of a first short code sequence in the first codebook; transmitting a signal spread using a spreading factor (SF) that is less than K, wherein transmitting the signal comprises transmitting the signal using a subsequence, of length SF, of the assigned first short code sequence.

Certain aspects of the present disclosure provide an apparatus for wireless communications. The apparatus generally includes a processor configured to assign, from a first codebook of N short code sequences of length K, a subset of the short code sequences to a number of user equipments (UEs), wherein the number is at least two and at most N; to receive a signal including uplink data or control signals from two or more of the UEs, wherein: a first uplink data or control signal is sent using a first subsequence of one of the assigned subset of short code sequences, and a second uplink data or control signal, different from the first uplink data or control signal, is sent using a second subsequence of one of the assigned subset of short code sequences or using one of the assigned subset of short code sequences; and to decode each uplink data or control signal in the signal based on the assigned subset of the short code sequences and subsequences of the short code sequences in the assigned subset of the short code sequences; and a memory coupled with the processor.

Certain aspects of the present disclosure provide an apparatus for wireless communications. The apparatus generally includes a processor configured to obtain a first codebook of N short code sequences of length K; to receive, from a base station (BS), an assignment of a first short code sequence in the first codebook; and to transmit a signal spread using a spreading factor (SF) that is less than K, wherein transmitting the signal comprises transmitting the signal using a subsequence, of length SF, of the assigned first short code sequence; and a memory coupled with the processor.

Certain aspects of the present disclosure provide an apparatus for wireless communications. The apparatus generally includes means for assigning, from a first codebook of N short code sequences of length K, a subset of the short code sequences to a number of user equipments (UEs), wherein the number is at least two and at most N; means for receiving a signal including uplink data or control signals from two or more of the UEs, wherein: a first uplink data or control signal is sent using a first subsequence of one of the assigned subset of short code sequences, and a second uplink data or control signal, different from the first uplink data or control signal, is sent using a second subsequence of one of the assigned subset of short code sequences or using one of the assigned subset of short code sequences; and means for decoding each uplink data or control signal in the signal based on the assigned subset of the short code sequences and subsequences of the short code sequences in the assigned subset of the short code sequences.

Certain aspects of the present disclosure provide an apparatus for wireless communications. The apparatus generally includes means for obtaining a first codebook of N short code sequences of length K; means for receiving, from a base station (BS), an assignment of a first short code sequence in the first codebook; means for transmitting a signal spread using a spreading factor (SF) that is less than K, wherein the means for transmitting the signal comprises means for transmitting the signal using a subsequence, of length SF, of the assigned first short code sequence.

Certain aspects of the present disclosure provide a computer-readable medium for wireless communications including instructions that, when executed by a processing system, cause the processing system to perform operations that generally include assigning, from a first codebook of N short code sequences of length K, a subset of the short code sequences to a number of user equipments (UEs), wherein the number is at least two and at most N; receiving a signal including uplink data or control signals from two or more of the UEs, wherein: a first uplink data or control signal is sent using a first subsequence of one of the assigned subset of short code sequences, and a second uplink data or control signal, different from the first uplink data or control signal, is sent using a second subsequence of one of the assigned subset of short code sequences or using one of the assigned subset of short code sequences; and decoding each uplink data or control signal in the signal based on the assigned subset of the short code sequences and subsequences of the short code sequences in the assigned subset of the short code sequences.

Certain aspects of the present disclosure provide a computer-readable medium for wireless communications including instructions that, when executed by a processing system, cause the processing system to perform operations that generally include obtaining a first codebook of N short code sequences of length K; receiving, from a base station (BS), an assignment of a first short code sequence in the first codebook; transmitting a signal spread using a spreading factor (SF) that is less than K, wherein transmitting the signal comprises transmitting the signal using a subsequence, of length SF, of the assigned first short code sequence.

Aspects generally include methods, apparatus, systems, computer readable mediums, and processing systems, as substantially described herein with reference to and as illustrated by the accompanying drawings.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
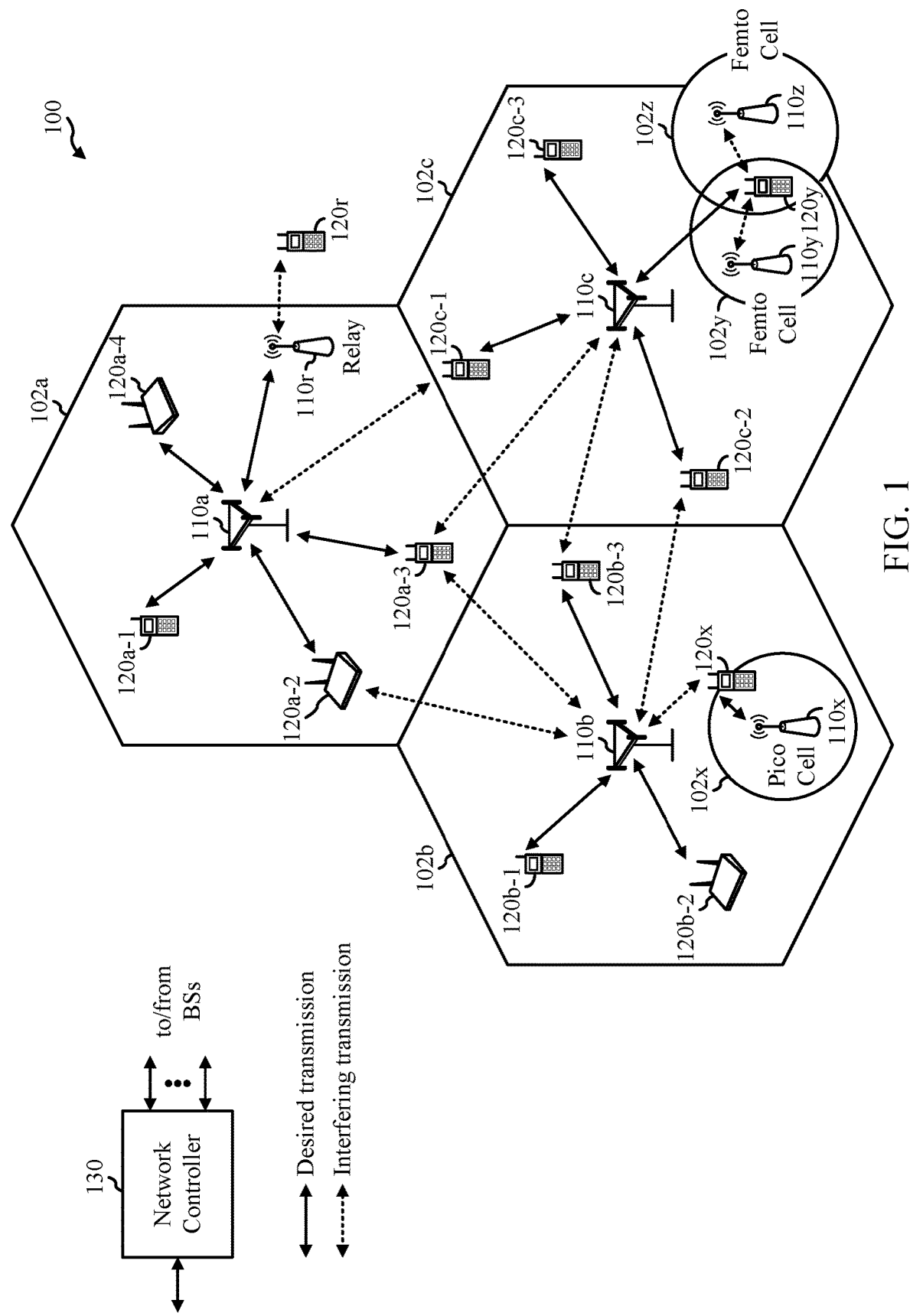
FIG. 1 is a block diagram conceptually illustrating an example telecommunications system, in accordance with certain aspects of the present disclosure.

Non-orthogonal multiple access (NOMA) allows the simultaneous transmission of more than one layer of data for more than one UE without time, frequency or spatial domain separation. Different layers of data may be separated by utilizing interference cancellation or iterative detection at the receiver. It has been agreed that NOMA should be investigated for diversified 5G usage scenarios and use cases and 5G should target to support uplink NOMA.

In an uplink NOMA system, signal transmitter and receiver are jointly optimized, so that multiple layers of data from more than one UE can be simultaneously delivered in the same resource. At the transmitter side, the information of different UEs can be delivered using the same time, frequency and spatial resource. At the receiver side, the information of different UEs can be recovered by advanced receivers such as interference cancellation or iterative detection receivers.

A key characteristic of the scrambling based NOMA schemes is that different scrambling sequences are used to distinguish between different UEs, and that an successive interference cancellation (SIC) algorithm is applied at the BS receiver to separate different UEs. Resource Spread Multiple Access (RSMA) is one example of a scrambling based NOMA scheme. In RSMA, a group of different UEs' signals are super positioned on top of each other, and each UE's signal is spread to the entire frequency/time resource assigned for the group. RSMA uses the combination of low rate channel codes and scrambling codes with good correlation properties to separate different UEs' signals.

In certain aspects, several different uplink multiplexing scenarios may be considered for non-orthogonal multiple access (NOMA). One example NOMA scheme may include a grant free NOMA scheme that does not include network assignments or grants of scrambling sequences. In certain aspects, another example NOMA scheme may include a grant based NOMA scheme that includes network assignment of scrambling sequences.

Certain aspects of the present disclosure discuss a two stage technique for generating, transmitting and decoding RSMA modulated streams including multi-layer RSMA modulated streams. These techniques include a two stage technique for generating, transmitting and decoding RSMA modulated streams including multi-layer RSMA streams on the uplink. In an aspect, the two stage technique includes two separate stages of scrambling one or more data streams, the two stages using different types of scrambling sequences with different lengths. In certain aspects, the two stage scrambling design for RSMA modulated streams may be used for both grant based and grant free scenarios.

NR may support various wireless communication services, such as Enhanced mobile broadband (eMBB) services targeting wide bandwidth (e.g., 80 MHz and wider) communications, millimeter wave (mmW) services targeting high carrier frequency (e.g., 27 GHz and higher) communications, massive machine-type communications (mMTC) services targeting non-backward compatible machine-type communications (MTC) techniques, and/or mission critical services targeting ultra-reliable low latency communications (URLLC). These services may include latency and reliability requirements. These services may also have different transmission time intervals (TTIs) to meet respective quality of service (QoS) requirements. In addition, these services may co-exist in the same subframe.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication networks such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). NR is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

Example Wireless Communications System

FIG. 1 illustrates an example wireless network 100, such as a new radio (NR) or 5G network, in which aspects of the present disclosure may be performed.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may be coupled to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a healthcare device, a medical device, a wearable device such as a smart watch, smart clothing, smart glasses, virtual reality goggles, a smart wrist band, smart jewelry (e.g., a smart ring, a smart bracelet, etc.), an entertainment device (e.g., a music device, a gaming device, a video device, a satellite radio, etc.), a vehicular component or sensor, a smart meter/sensor, industrial manufacturing equipment, a positioning device (e.g., GPS, Beidou, GLONASS, Galileo, terrestrial-based), or any other suitable device that is configured to communicate via a wireless or wired medium. Some UEs may be considered machine-type communication (MTC) devices or enhanced or evolved MTC (eMTC) devices. MTC may refer to communication involving at least one remote device on at least one end of the communication and may include forms of data communication which involve one or more entities that do not necessarily need human interaction. MTC UEs may include UEs that are capable of MTC communications with MTC servers and/or other MTC devices through Public Land Mobile Networks (PLMN), for example. Some UEs may be considered Internet of Things devices. The Internet of Things (IoT) is a network of physical objects or "things" embedded with, e.g., electronics, software, sensors, and network connectivity, which enable these objects to collect and exchange data. The Internet of Things allows objects to be sensed and controlled remotely across existing network infrastructure, creating opportunities for more direct integration between the physical world and computer-based systems, and resulting in improved efficiency, accuracy and economic benefit. When IoT is augmented with sensors and actuators, the technology becomes an instance of the more general class of cyber-physical systems, which also encompasses technologies such as smart grids, smart homes, intelligent transportation and smart cities. Each "thing" is generally uniquely identifiable through its embedded computing system but is able to interoperate within the existing Internet infrastructure. Narrowband IoT (NB-IoT) is a technology being standardized by the 3GPP standards body. This technology is a narrowband radio technology specially designed for the IoT, hence its name. Special focuses of this standard are on indoor coverage, low cost, long battery life and large number of devices. MTC/eMTC and/or IoT UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth (e.g., system frequency band) into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using time division duplex (TDD). A single component carrier bandwidth of 100 MHz may be supported. NR resource blocks may span 12 sub-carriers with a sub-carrier bandwidth of 75 kHz over a 0.1 ms duration. Each radio frame may consist of 2 half frames, each half frame consisting of 5 subframes, with a length of 10 ms. Consequently, each subframe may have a length of 1 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time —frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., eNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
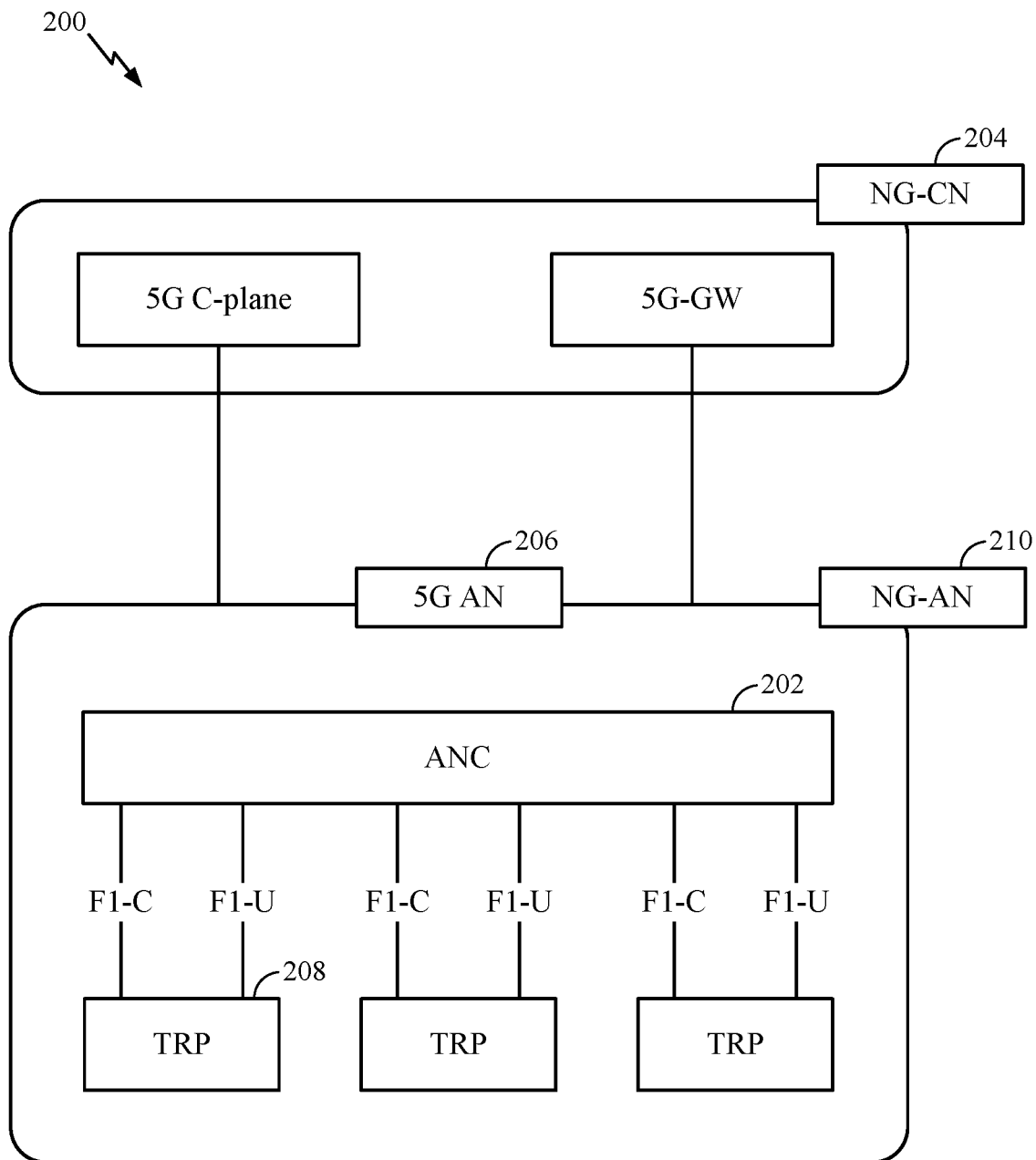
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed or present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
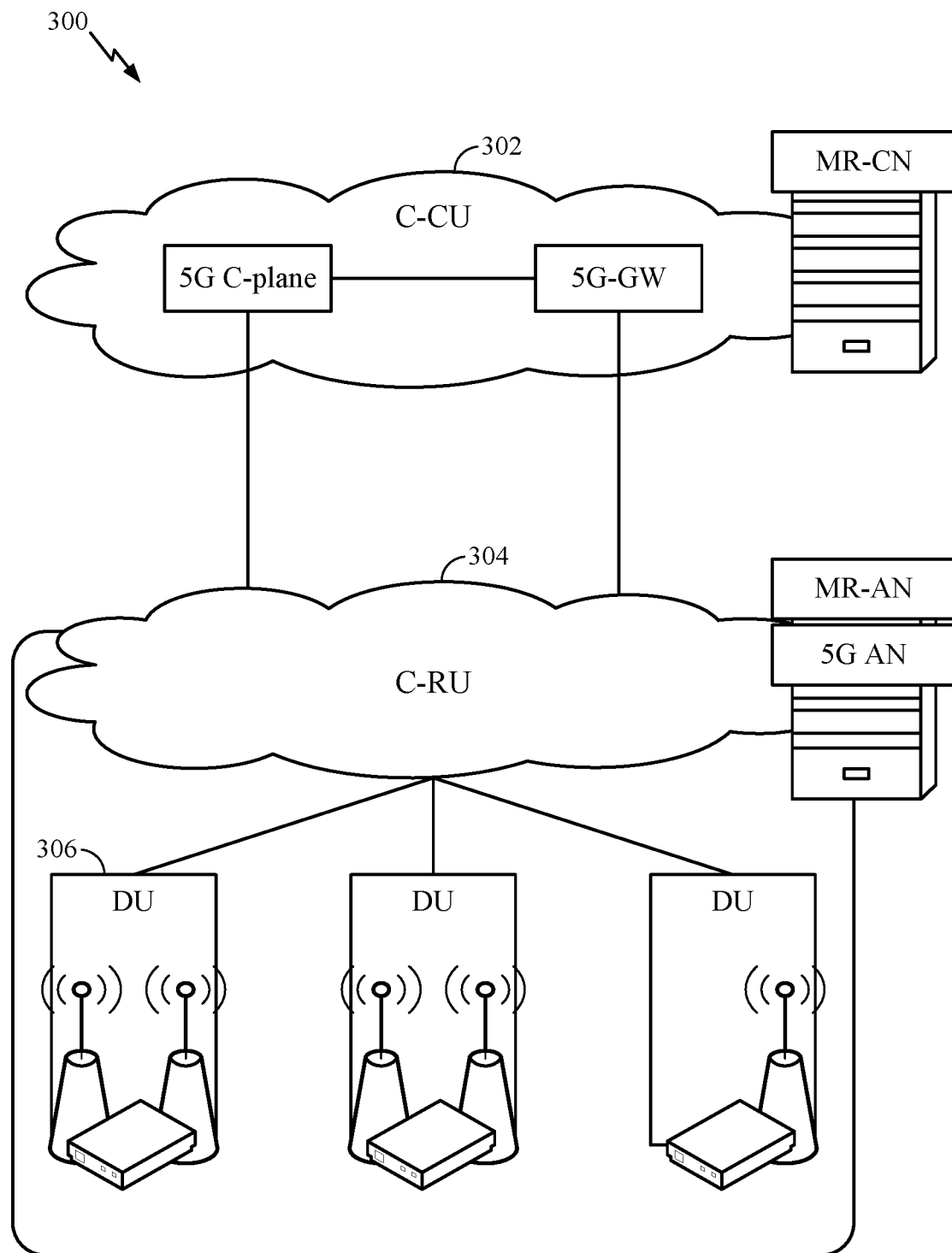
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
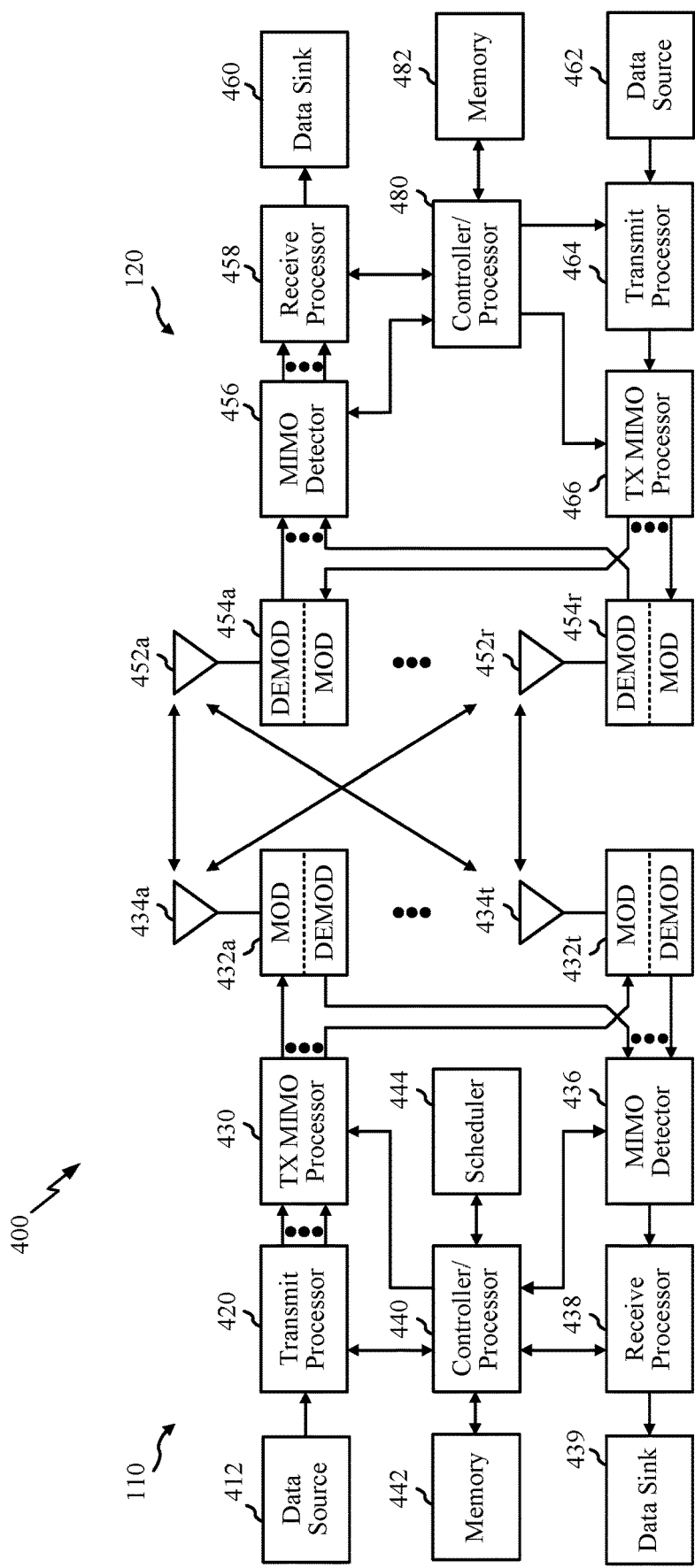
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein and illustrated with reference to FIGS. 8-11.

FIG. 4 shows a block diagram of a design of a BS 110 and a UE 120, which may be one of the BSs and one of the UEs in FIG. 1. For a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. For example, the TX MIMO processor 430 may perform certain aspects described herein for RS multiplexing. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DE-MODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. For example, MIMO detector 456 may provide detected RS transmitted using techniques described herein. A receive processor 458 may process (e.g., demodulate, deinterleave, and decode) the detected symbols, provide decoded data for the UE 120 to a data sink 460, and provide decoded control information to a controller/processor 480. According to one or more cases, CoMP aspects can include providing the antennas, as well as some Tx/Rx functionalities, such that they reside in distributed units. For example, some Tx/Rx processing can be done in the central unit, while other processing can be done at the distributed units. For example, in accordance with one or more aspects as shown in the diagram, the BS modulator/demodulators 432 may be in the distributed units.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the processes for the techniques described herein. The processor 480 and/or other processors and modules at the UE 120 may also perform or direct, e.g., execution of the functional blocks illustrated in FIG. 10, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
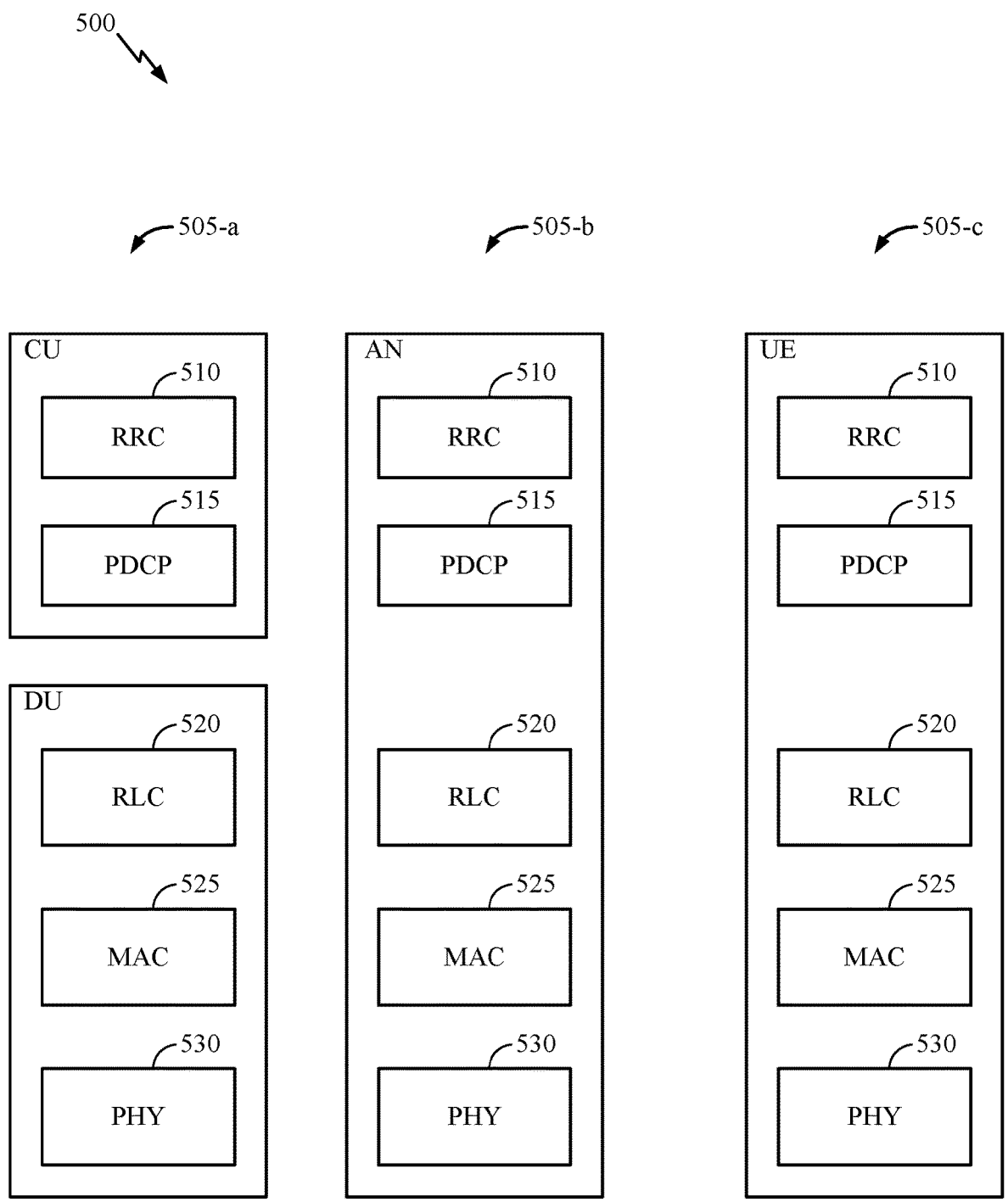
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like.). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack 505-c (e.g., the RRC layer 510, the PDCP layer 515, the RLC layer 520, the MAC layer 525, and the PHY layer 530).

Figure 6:
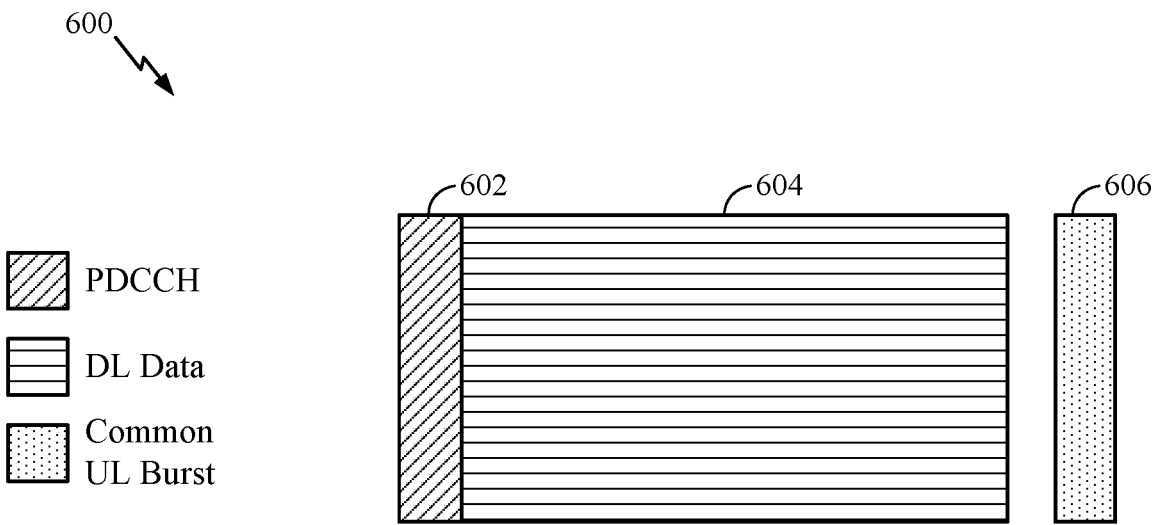
FIG. 6 illustrates an example of a downlink-centric (DL-centric) subframe, in accordance with certain aspects of the present disclosure.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information. As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
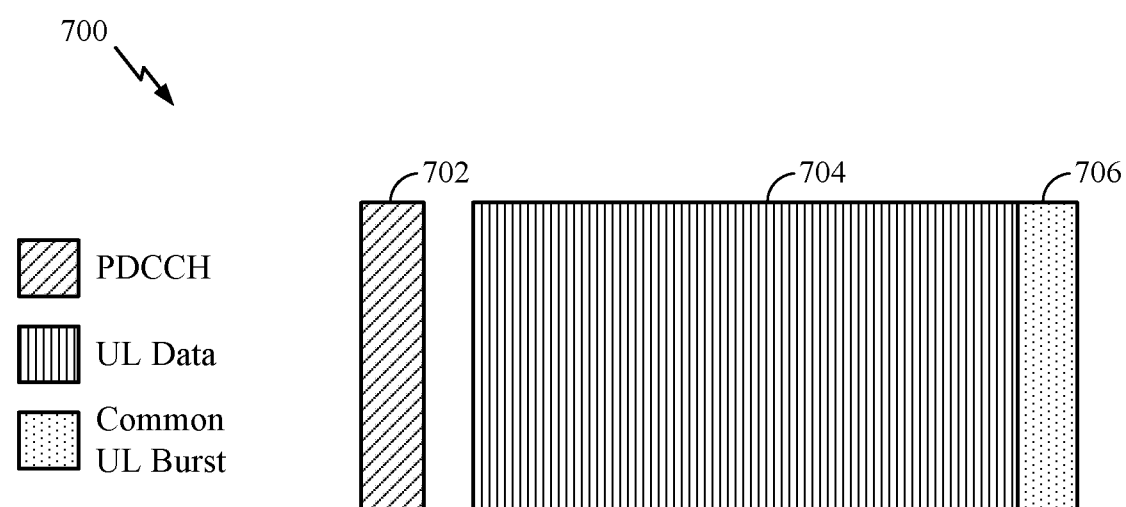
FIG. 7 illustrates an example of an uplink-centric (UL-centric) subframe, in accordance with certain aspects of the present disclosure.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion described above with reference to FIG. 6. The UL-centric subframe may also include an UL data portion 704. The UL data portion 704 may sometimes be referred to as the payload of the UL-centric subframe. The UL data portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additionally or alternatively include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Design for Resource Spread Multiple Access Modulated Streams

In wireless communications, multiple access technology allows several user devices to share one radio transmission resource. Over the past several years, the innovation of multiple access technology has been an essential part of each new generation of cellular mobile systems. Various usage scenarios including enhanced mobile broadband (eMBB) communications, massive machine type communications (mMTC), and ultra-reliable and low latency communications (URLLC) have been defined for 5G. Compared with 4G systems, two of the key 5G capabilities are to provide higher connection density and spectral efficiency. 4G cellular systems are mainly based on orthogonal multiple access (OMA) technologies. However, in recent years non-orthogonal multiple access has become an important candidate technology for 5G systems.

Non-orthogonal multiple access (NOMA) allows the simultaneous transmission of more than one layer of data for more than one UE without time, frequency or spatial domain separation. Different layers of data may be separated by utilizing interference cancellation or iterative detection at the receiver. NOMA may be used to further enhance the spectral efficiency over OMA, in order to achieve the multiple UE channel capacity. Furthermore, NOMA may significantly increase the number of UE connections, which is quite beneficial for 5G systems. In addition, NOMA does not rely on the knowledge of instantaneous channel state information (CSI) of frequency selective fading, and thus a robust performance gain in practical wide area deployments may be expected irrespective of UE mobility or CSI feedback latency. Uplink NOMA schemes have been studied in 3GPP RAN WG1 (working group 1). It has been agreed that NOMA should be investigated for diversified 5G usage scenarios and use cases and 5G should target to support uplink NOMA.

In an uplink NOMA system, signal transmitter and receiver are jointly optimized, so that multiple layers of data from more than one UE can be simultaneously delivered in the same resource. At the transmitter side, the information of different UEs can be delivered using the same time, frequency and spatial resource. At the receiver side, the information of different UEs can be recovered by advanced receivers such as interference cancellation or iterative detection receivers.

A number of NOMA schemes have been proposed. The difference between these schemes is mainly on signature design for UEs, i.e., whether a scrambling sequence, an interleaver, or a spreading code is used to differentiate between UEs. Thus, the three main categories of NOMA schemes include scrambling based NOMA schemes, interleaving based NOMA schemes, and spreading based NOMA schemes.

A key characteristic of the scrambling based NOMA schemes is that different scrambling sequences are used to distinguish between different UEs, and that a successive interference cancellation (SIC) algorithm is applied at a receiver (e.g., a receiver in a BS) to separate signals of different UEs. Resource Spread Multiple Access (RSMA) is one example of a scrambling based NOMA scheme. In RSMA, a group of signals of different UEs are super positioned on top of each other (i.e., in time, frequency, and space), and the signal of each UE is spread to the entire frequency and time resource assigned for the group. Different signals of the UEs within the group are not necessarily orthogonal to each other and could potentially cause inter-UE interference. Spreading of bits to the entire resource enables decoding at a signal level below background noise and interference. RSMA uses the combination of low rate channel codes and scrambling codes with good correlation properties to separate signals of different UEs. Depending on application scenarios, the RSMA includes single-carrier RSMA and multi-carrier RSMA.

Figure 8:
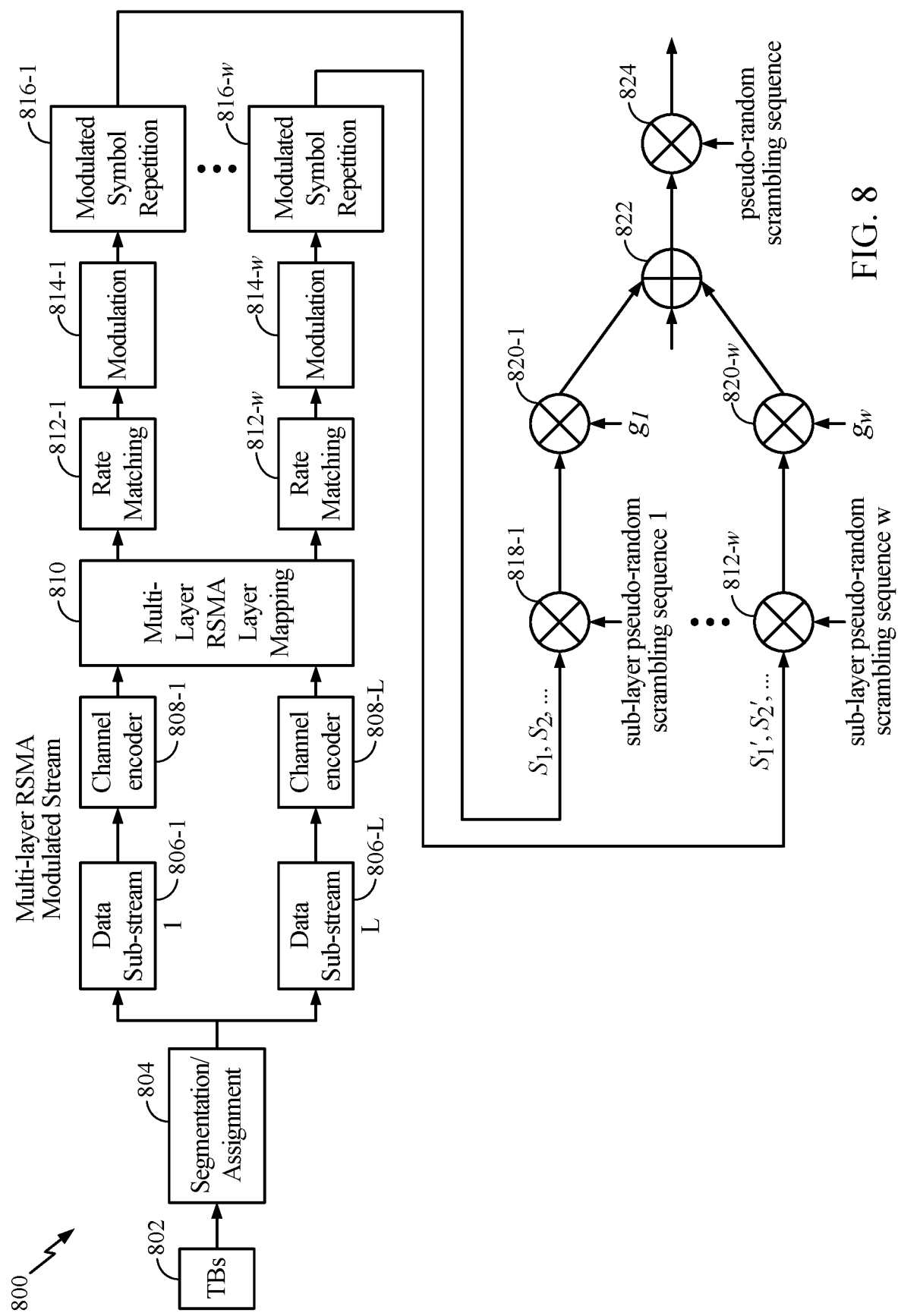
FIG. 8 illustrates an example design 800 for generating a multi-layer RSMA modulated stream.

FIG. 8 illustrates an example design 800 for generating a multi-layer RSMA modulated stream. As shown, one or more transport blocks (TBs) 802 are segmented 804 and assigned to different data sub-streams (806-1 to 806-L). Each data sub-stream (806-1 to 806-L) is separately encoded (808-1 to 808-L). In an aspect, the one or more transport blocks may be commonly encoded before segmentation and assignment to different data sub-streams. At 810, each encoded data sub-stream is mapped to one or more (i.e., w) RSMA layers based on a multi-layer RSMA layer mapping scheme. For example, each encoded sub-stream is mapped to a single and different layer (one to one mapping), each encoded stream is mapped to multiple layers (one to many mapping), multiple encoded sub-streams are mapped to one layer (many to one mapping), or a combination of the above. For many to one mapping, a BS (e.g., a next generation NodeB (gNB)) may configure a number of sub-layers for each layer and communicate that configuration to UE(s) via system information broadcasts (SIBs) and/or RRC signaling. The RSMA layer mapping is followed by rate matching for each of the RSMA layers or sub-layers 812-1 to 812-$w$, modulation of each of the RSMA layers or sub-layers 814-1 to 814-$w$, and modulation symbol repetition of each of the RSMA layers or sub-layers 816-1 to 816-$w$ (e.g., spreading). In an aspect, the modulation symbol repetition at 816-1 to 816-$w$ includes repeating the modulation symbols by a spreading factor (SF). For example, if the SF=X, the modulation symbols are spread X times. In an aspect, the spreading factor may be the same or different across different RSMA layers or sub-layers. The modulation symbols of each sub-layer of each of the RSMA layers or sub-layers are then scrambled at 818-1 to 818-$w$ (e.g., where w is the total number of layers or sub-layers) by a sub-layer pseudo-random number (PN) scrambling sequence. Each sub-layer may be scrambled with the same or different scrambling sequence. A sub-layer PN sequence for each layer or sub-layer may include repetition of an orthogonal code (e.g., with permutation). In an aspect, the orthogonal code is generally a short code that is extended by repeating the code or repeating the code with permutation across layers. In an aspect, if the number of layers or sub-layers is larger than the number of orthogonal code sequences, repetition of quasi-orthogonal sub-layer code (e.g., with permutation) may be performed. In an aspect, quasi-orthogonal code includes Welch bound achieving code.

An additional phase rotation and/or power scaling factor $g_i$ may be applied to the layers or sub-layers at 820-1 to 820-$w$. The modulation symbols of the different layers or sub-layers may be synchronized and added at 822 to form an added modulation symbol stream, and an outer scrambling of the added modulation symbol stream may be performed at 824. In an aspect, the outer scrambling includes scrambling the added modulation symbol stream using an outer pseudo-random number scrambling sequence. In an aspect, the outer PN scrambling sequence is different from the sub-layer PN scrambling sequences.

In certain aspects, in a single TB case (i.e., transmission of a single TB by a transmitter), a single TB is segmented into multiple data streams and the multi-layer RSMA layer mapping (e.g., the multi-layer RSMA layer mapping at 810, described with respect to FIG. 8, above) includes mapping each data stream to a different RSMA layer (e.g., one to one mapping).

In certain aspects, in a multiple TB case (i.e., transmission of multiple TBs by a transmitter), multiple TBs may be assigned to different data streams. In an aspect, the multi-layer RSMA layer mapping (e.g., the multi-layer RSMA layer mapping at 810, described with respect to FIG. 8, above) includes mapping each data stream to a different RSMA layer (e.g., one to one mapping). In an aspect, spreading the modulation symbols (e.g., the modulated symbol repetition at 816-1 to 816-$w$, described with respect to FIG. 8, above) of each sub-layer or layer may include applying the same number (X-times) of repetitions of modulation symbols across the multiple RSMA layers. As noted above, the sub-layer PN sequence for each layer or sub-layer may be a repetition of a short code of X length (e.g., short code is quasi-orthogonal or orthogonal).

In certain aspects, the multi-layer RSMA layer mapping (e.g., the multi-layer RSMA layer mapping at 810, described with respect to FIG. 8, above) includes mapping each data stream to multiple RSMA layers (e.g., one to many mapping). The number of repetitions (X-times) of modulation symbols (e.g., the modulated symbol repetition at 816-1 to 816-$w$, described with respect to FIG. 8, above) may be different across the multiple RSMA layers or sub-layers.

In certain aspects, several different uplink multiplexing scenarios may be considered for non-orthogonal multiple access (NOMA). One example NOMA scheme may include a grant free NOMA scheme that does not include network assignments or grants of scrambling sequences. For example, the sub-layer scrambling sequences and the outer scrambling sequence (as shown in FIG. 8) are not assigned by the network (e.g., gNB), but are selected by the UE. In an aspect, this type of NOMA may relate to mMTC scenarios. In certain aspects, since scrambling sequences are not assigned by the network, a random multi-user (MU) codebook may be used by a UE for scrambling in a grant free NOMA.

In certain aspects, another example NOMA scheme may include a grant-based NOMA scheme that includes network assignment of scrambling sequences. In an aspect, CSI may not be available at the gNB for the grant-based NOMA. In an aspect, this type of NOMA may relate to a URLLC scenario in which SRS and delay may be crucial and the UE may send only short packets, and thus CSI may not be available. In an aspect, the grant-based NOMA may also relate to eMBB in RRC-idle state, for example, where the UE has been in an idle state for a while, and thus, CSI is not available. The grant-based NOMA may use a fixed MU codebook assigned by the network.

Certain aspects of the present disclosure discuss a two stage technique for generating, transmitting and decoding RSMA modulated streams including multi-layer RSMA modulated streams. These techniques include a two stage technique for generating, transmitting and decoding RSMA modulated streams including multi-layer RSMA streams on the uplink. In an aspect, the two stage technique includes two separate stages of scrambling one or more data streams, the two stages using different types of scrambling sequences with different lengths. In certain aspects, the two stage scrambling design for RSMA modulated streams may be used for both grant based and grant free scenarios.

In some cases, different UEs (e.g., UEs 1 and 2) are assigned different spreading factors, namely SF1 and SF2 respectively. Thus, data streams for the UEs 1 and 2 are spread based on their respective assigned SFs. In a first scrambling stage, each layer of a particular UE (e.g., UE 1 and 2) is assigned a different short code that corresponds to the respective assigned SF for the UE. The different short codes serve to distinguish the multiple layers of the same UE. The first layer of UE1 is assigned layer idx0 corresponding to SF1 and the second layer of UE1 is assigned layer idx1 corresponding to SF1. Similarly, the first layer of UE2 is assigned idx0 corresponding to SF2 and the second layer of UE2 is assigned layer idx1 corresponding to SF2. The parameters "Layer 1" and "Layer 2" represent different total number of layers corresponding to SF1 and SF2 respectively.

In a second scrambling stage, each scrambled modulation symbol stream (from the first stage) for each RSMA layer of a particular UE is scrambled again by a common UE-specific long sequence. Different UE-specific long sequences are used for the UEs 1 and 2. Thus, while the different long sequences are used to distinguish transmissions from the different UEs, different short codes are used to distinguish between layers of a particular UE.

In some cases, scrambling sequence may allow the base station to distinguish at least one of different UEs or transmission layers, based on the different sequences in the set used for scrambling the transmissions.

Figure 9:
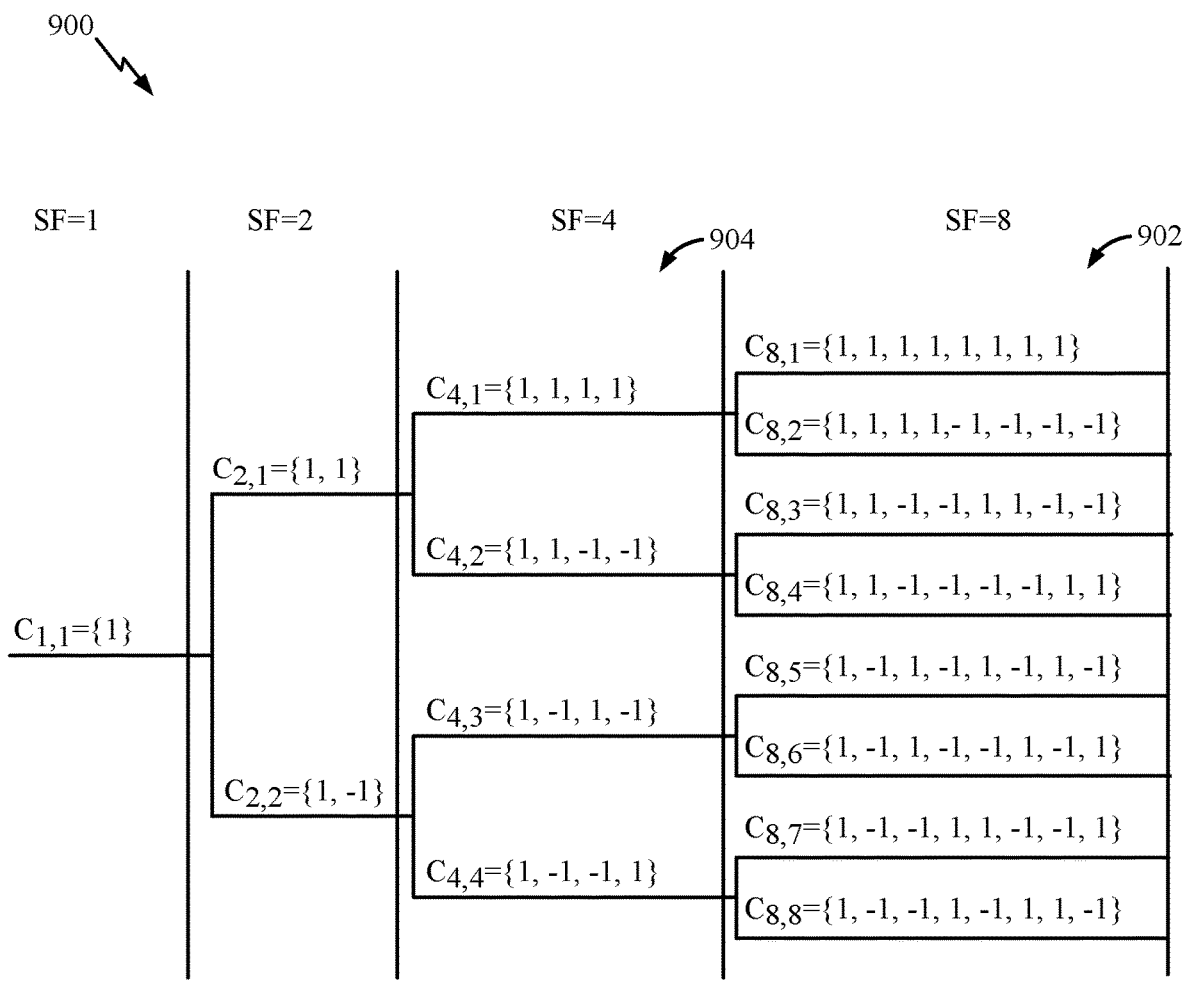
FIG. 9 illustrates an exemplary set of variable spreading factor codes, in accordance with certain aspects of the present disclosure.

FIG. 9 illustrates an exemplary set of variable spreading factor codes 900, such as may be used in a CDMA communications system. The exemplary set of variable spreading factor codes may be referred to as CDMA Welch codes. In the exemplary set of variable spreading factor codes, a subsequence of a spreading code with a larger spreading factor (SF) is a spreading code with a smaller spreading factor. For example, the first code with SF=8, illustrated at 902, has a first subsequence {1, 1, 1, 1}, which is the same as the sequence of the first code with SF=4, illustrated at 904.

Example Variable Spreading Factor Codes for Non-Orthogonal Multiple Access

Aspects of the present disclosure provide techniques for generating and utilizing variable spreading factor codes for non-orthogonal multiple access (NOMA). For example, the variable spreading factor code sequences described herein may be used for (1 or 2-stage) scrambling for RSMA transmissions (e.g., implemented in block 818 or 820 in FIG. 8).

Figure 10:
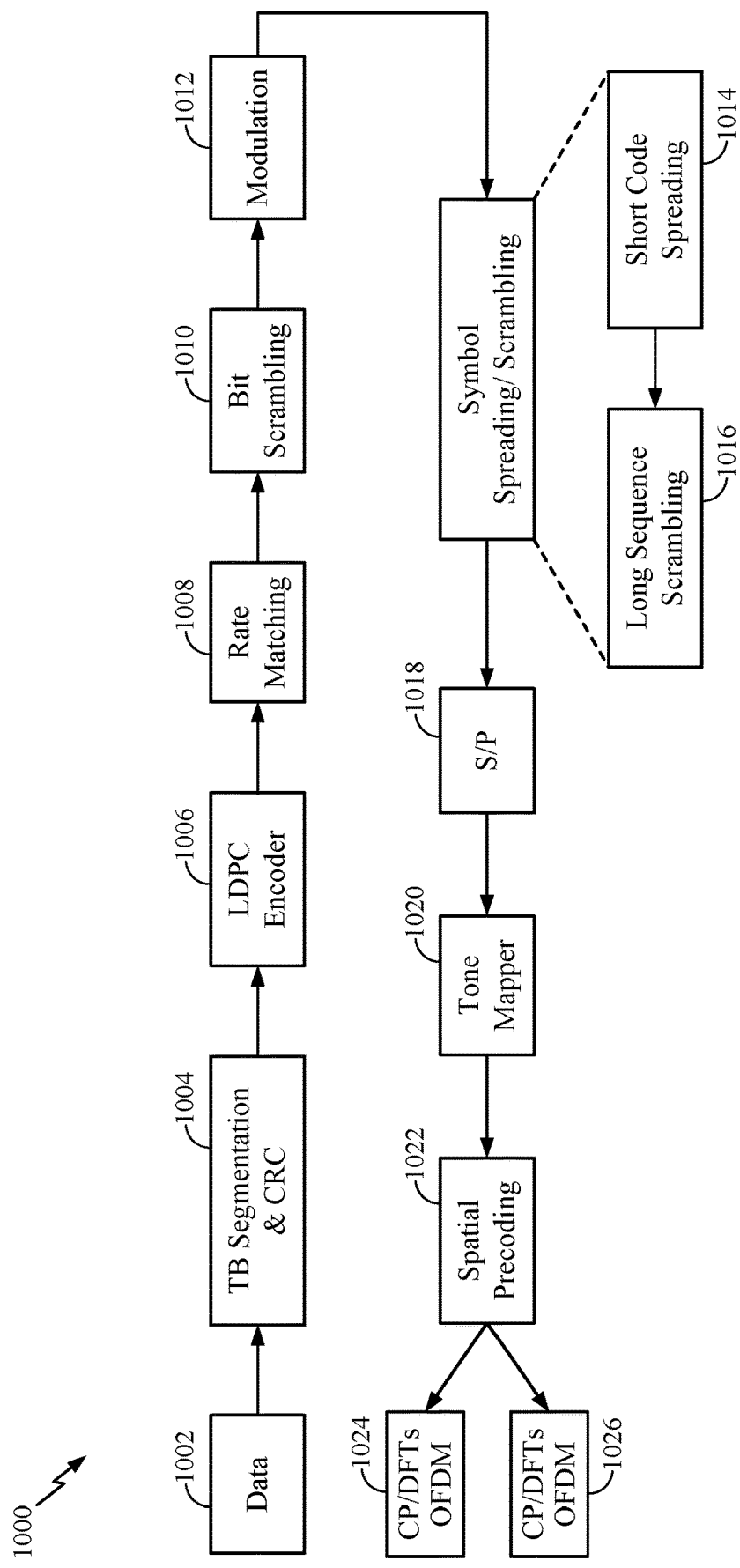
FIG. 10 shows a schematic diagram 1000 of an exemplary transmit chain of a wireless device, in accordance with aspects of the present disclosure.

FIG. 10 shows a schematic diagram 1000 of an exemplary transmit chain of a wireless device operable in a resource spread multiple access (RSMA) communications system, in accordance with aspects of the present disclosure. In the exemplary transmit chain, data 1002 is first segmented into transport blocks and a CRC is added at 1004. The transport blocks are then encoded using a low density polar code (LDPC) encoder at 1006. The polar encoded data is then rate matched, at 1008, to assigned transmission resources (e.g., resource elements of resource blocks). The rate-matched data is scrambled at 1010. At 1012, the scrambled data is modulated to symbols. At 1014, the symbols are first spread using a short spreading code (e.g., a short code sequence or subsequence, as described below) and then scrambled at 1016 using a long scrambling sequence. The spreading and scrambling illustrated at 1014 and 1016 may be referred to as a two-stage scrambling for a NOMA communications scheme. The symbols are shortened or punctured at 1018. The symbols are mapped to tones of a bandwidth at 1020. A precoder performs spatial precoding on the tones at 1022. At 1024 and/or 1026, the tones are transmitted as cyclic prefix OFDM (CP-OFDM) or discrete Fourier transform single carrier OFDM (DFT-s-OFDM) waveforms via one or more transmitters and antennas.

In a two-stage NOMA communications scheme as described herein, transmissions from each device (e.g., UE) may be distinguished by different short spreading codes (i.e., the short spreading codes used at 1014) used to spread the transmissions and/or by different long scrambling sequences (i.e., the long sequences used at 1016) used to scramble the transmissions.

Figure 11:
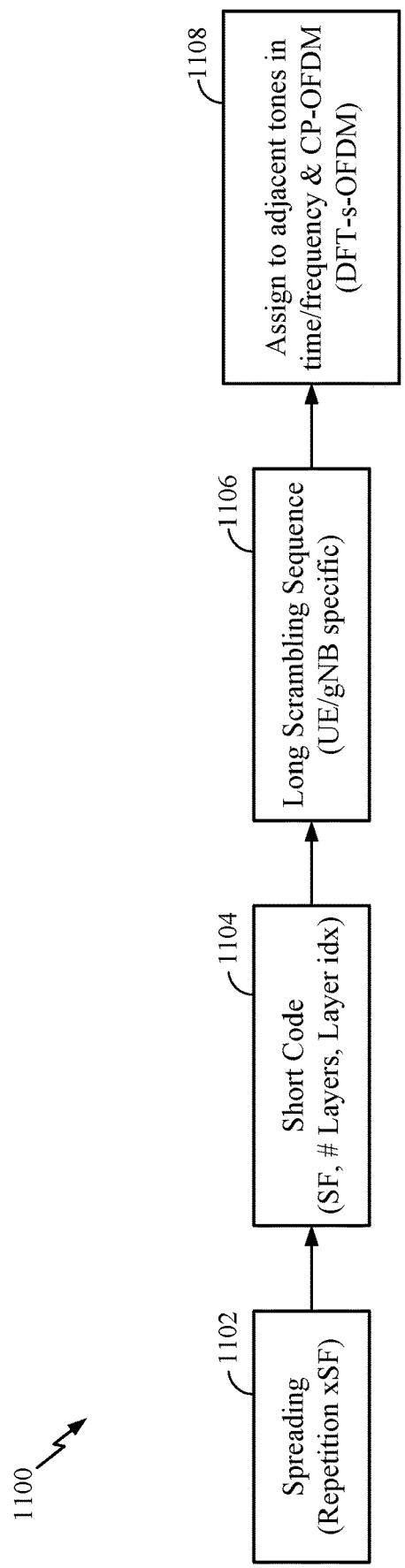
FIG. 11 illustrates an exemplary two-stage hybrid NOMA communications scheme, according to aspects of the present disclosure.

FIG. 11 illustrates an exemplary two-stage hybrid NOMA communications scheme 1100, according to aspects of the present disclosure. In a two-stage NOMA communications scheme, devices (e.g., base stations and UEs) in a wireless communications system may utilize a two-stage spreading and scrambling technique. In the two-stage hybrid NOMA scheme, symbols are first spread (e.g., repeated) according to a spreading factor (SF) at 1102. A short code (e.g., a short code sequence or subsequence, as described below) is used to spread the symbols at 1104. The short code may be determined based on the spreading factor, number of layers to be transmitted, and a layer index of a transmission. At 1106, the spread symbols are scrambled with a long scrambling sequence, which may be device (e.g., UE or gNB) specific. The spread and scrambled symbols are then assigned to adjacent tones and transmitted as a CP-OFDM or DFT-s-OFDM waveform at 1108.

According to aspects of the present disclosure, a spreading factor (SF) used in a two-stage hybrid NOMA communications scheme may be selected from the set {2, 4, 6, 8, 12, . . . }.

In aspects of the present disclosure, short spreading codes may be selected from a short sequence codebook. A short sequence codebook may be designed for each pair (SF, [total number of NOMA layers]), where [total number of NOMA layers]≥SF and length of the codes is equal to the SF.

According to aspects of the present disclosure, [total number of NOMA layers] may be equal to a [total number of UEs] that may be transmitting at one instant.

In aspects of the present disclosure, a codebook for use in a two-stage NOMA communications system may be constructed from Chirp-based sequence sets, which may be designed to meet a desired Welch bound (e.g., have an optimal cross correlation property).

According to aspects of the present disclosure, codes in a codebook for use in a two-stage NOMA communications system may be constant-magnitude for each codeword. Using codes with constant magnitude is desirable to allow a lower peak-to-average power ratio (PAPR) of a power amplifier used in transmitting DFT-s-OFDM waveforms.

In aspects of the present disclosure, a long scrambling sequence for use in a two-stage NOMA communications system may be determined by down-selecting from a Gold, Chu, and/or PN sequence. A long scrambling sequence may be a device (e.g., UE or gNB) specific configuration.

According to aspects of the present disclosure, a single or multi-layer assignment may be made to each UE for the UE to transmit (e.g., to a BS).

Figure 12:
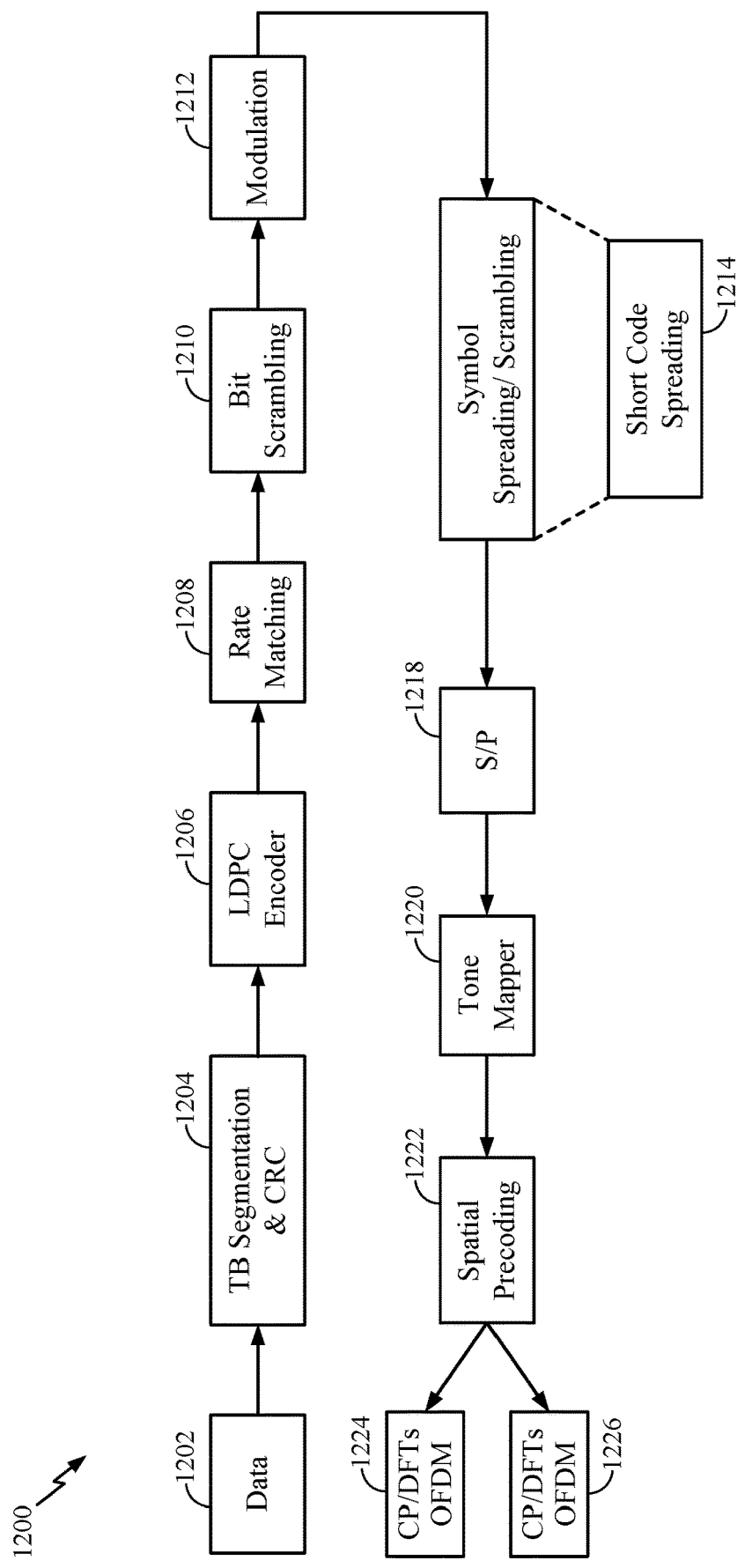
FIG. 12 shows a schematic diagram of an exemplary transmit chain of a wireless device, in accordance with aspects of the present disclosure.

In aspects of the present disclosure, a single-stage NOMA communications system may use short codes for spreading and not scramble using a long scrambling sequence, as shown in FIG. 12.

FIG. 12 shows a schematic diagram 1200 of an exemplary transmit chain of a wireless device operable in a single-stage NOMA communications system, in accordance with aspects of the present disclosure. In the exemplary transmit chain, data 1202 is first segmented into transport blocks and a CRC is added at 1204. The transport blocks are then encoded using a low density polar code (LDPC) encoder at 1206. The polar encoded data is then rate matched at 1208. The rate-matched data is scrambled at 1210. At 1212, the scrambled data is modulated to symbols. At 1214, the symbols are spread using a short spreading code (e.g., a short code sequence or subsequence, as described below) but, unlike in the transmit chain 1000 in FIG. 10, the symbols are not scrambled using a long scrambling sequence. The symbols are shortened or punctured at 1218. The symbols are mapped to tones of a bandwidth at 1220. A precoder performs spatial precoding on the tones at 1222. At 1224 and/or 1226, the tones are transmitted as cyclic prefix OFDM (CP-OFDM) or discrete Fourier transform single carrier OFDM (DFT-s-OFDM) waveforms via one or more transmitters and antennas.

Figure 13:
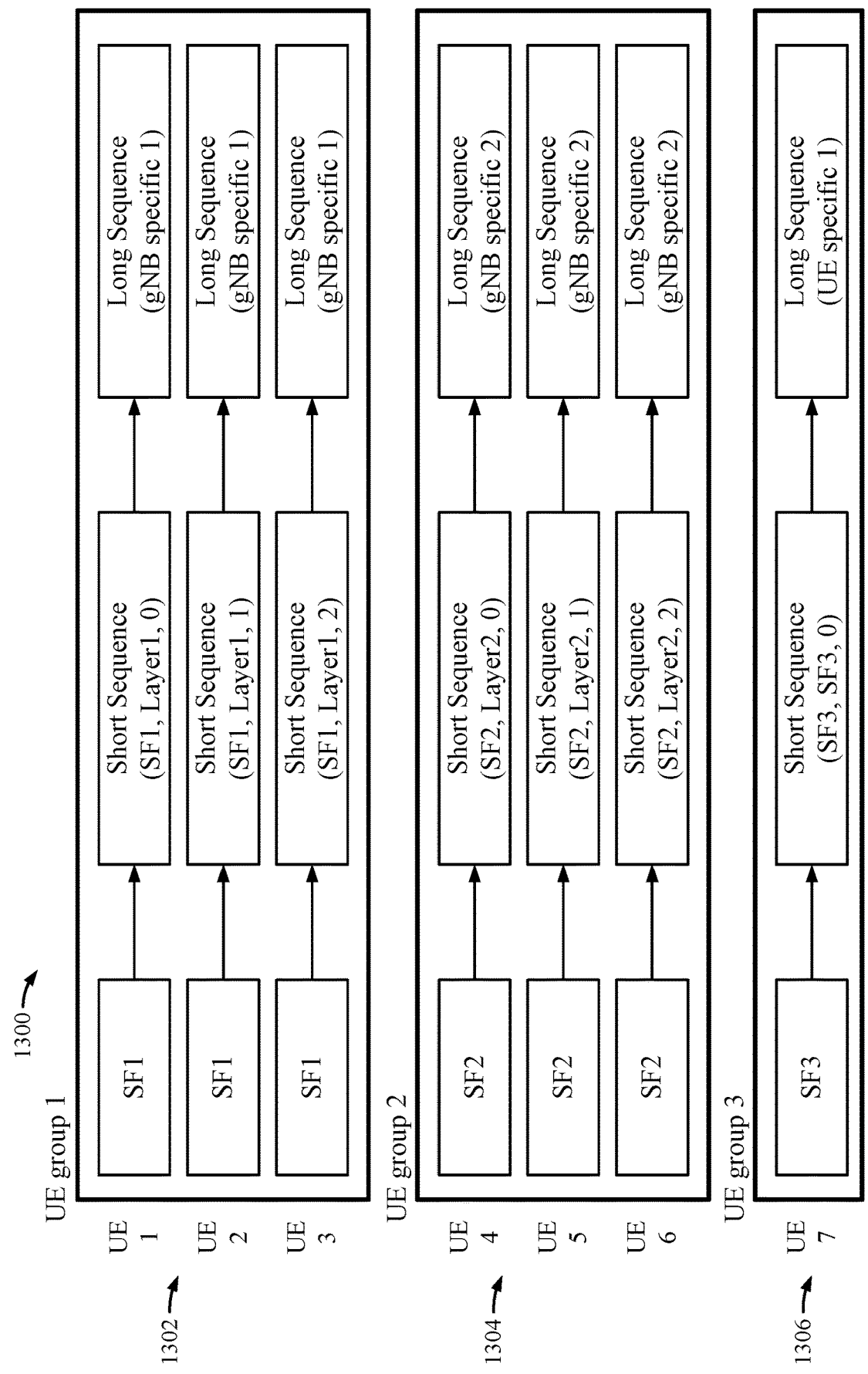
FIG. 13 is a schematic diagram illustrating an RSMA NOMA scheme, according to previously known techniques.

FIG. 13 is a schematic diagram 1300 illustrating an RSMA NOMA scheme, according to previously known techniques. In the scheme, three UEs that transmit using a spreading factor SF1 are grouped in a group 1302. Three UEs that transmit using a spreading factor SF2 are grouped in a group 1304. Another UE that transmits using a spreading factor SF3 is in a third group 1306. Transmissions from each UE are distinguished from transmissions by every other UE by a different short sequence or by a different long sequence. Thus, in the exemplary scheme, transmissions from two UEs in the same group (e.g., UE1 and UE3) are distinguished based on the short sequences used in their transmissions have different indices (e.g., the short sequence for UE1 has index=0, while the short sequence for UE3 has index=2).

According to aspects of the present disclosure, transmissions by multiple devices (e.g., UEs) may be multiplexed in a set of time and frequency resources in an RSMA transmission scheme, and the UEs may not all use the same spreading factor in the transmissions. Another device (e.g., a BS) receiving the transmissions may differentiate the transmissions based on the short sequence that each device used in spreading the symbols of the transmission.

Figure 14:
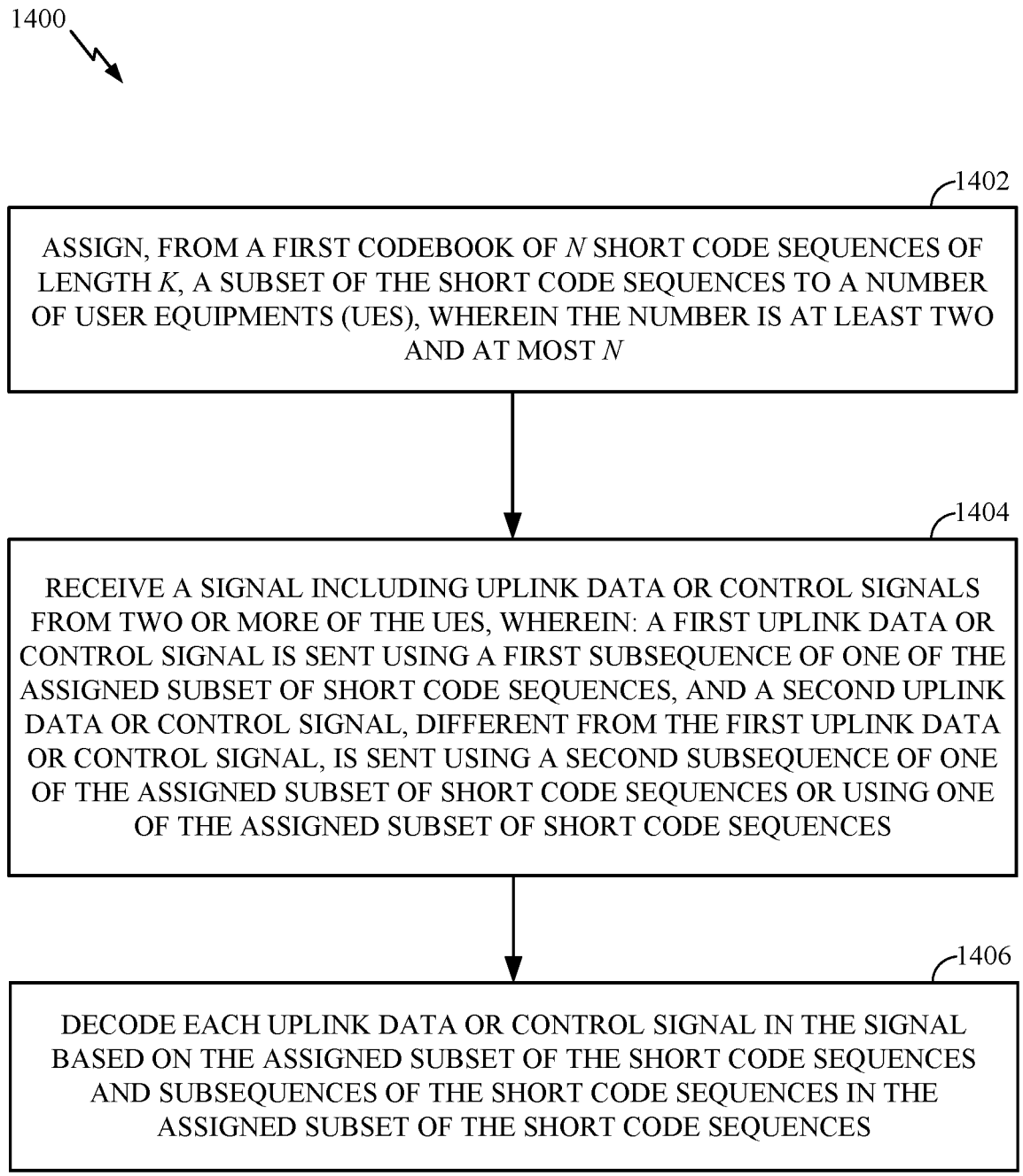
FIG. 14 illustrates operations performed by a base station, in accordance with certain aspects of the present disclosure.

FIG. 14 illustrates example operations 1400 for wireless communications that may be performed by a base station (e.g., a gNB, such as BS 110a in FIG. 1) in accordance with aspects of the present disclosure.

Operations 1400 begin, at block 1402, by the BS assigning, from a first codebook of N short code sequences of length K, a subset of the short code sequences to a number of user equipments (UEs), wherein the number is at least two and at most N. For example, BS 110a assigns, from a first codebook of N (e.g., 9) short code sequences of length K (e.g., 8), a subset of the short code sequences (e.g., two short code sequences) to a number of UEs (e.g., UEs 120a-1 and 120a-2, shown in FIG. 1)

At block 1404, operations 1400 continue with the BS receiving a signal including uplink data or control signals from two or more of the UEs, wherein: a first transmission is sent using a first subsequence of one of the assigned subset of short code sequences, and a second transmission, different from the first transmission, is sent using a second subsequence of one of the assigned subset of short code sequences or using one of the assigned subset of short code sequences. Continuing the example from above, BS 110a receives a signal including uplink data or control signals from UEs 120a-1 and 120a-2, wherein: a first uplink data or control signal (e.g., from UE 120a-1) is sent using a first subsequence of a first one of the two assigned short code sequences (e.g., the short code sequence assigned to UE 120a-1) and a second uplink data or control signal (e.g., from UE 120a-2), different from the first uplink data or control signal, is sent using a second subsequence of a second one of the two assigned short code sequences or using the second one of the assigned subset of short code sequences (e.g., the short code sequence assigned to UE 120a-2).

At 1406, operations 1400 continue with the BS decoding each uplink data or control signals in the signal based on the assigned subset of the short code sequences and subsequences of the short code sequences in the assigned subset of the short code sequences. Continuing the example from above, BS 110a decodes each uplink data or control signals in the signal (i.e., the first uplink data or control signals from UE 120a-1 and the second uplink data or control signals from UE 120a-2, mentioned in block 1404) based on the assigned subset of the short code sequences and subsequences of the short code sequences in the assigned subset of the short code sequences.

Figure 15:
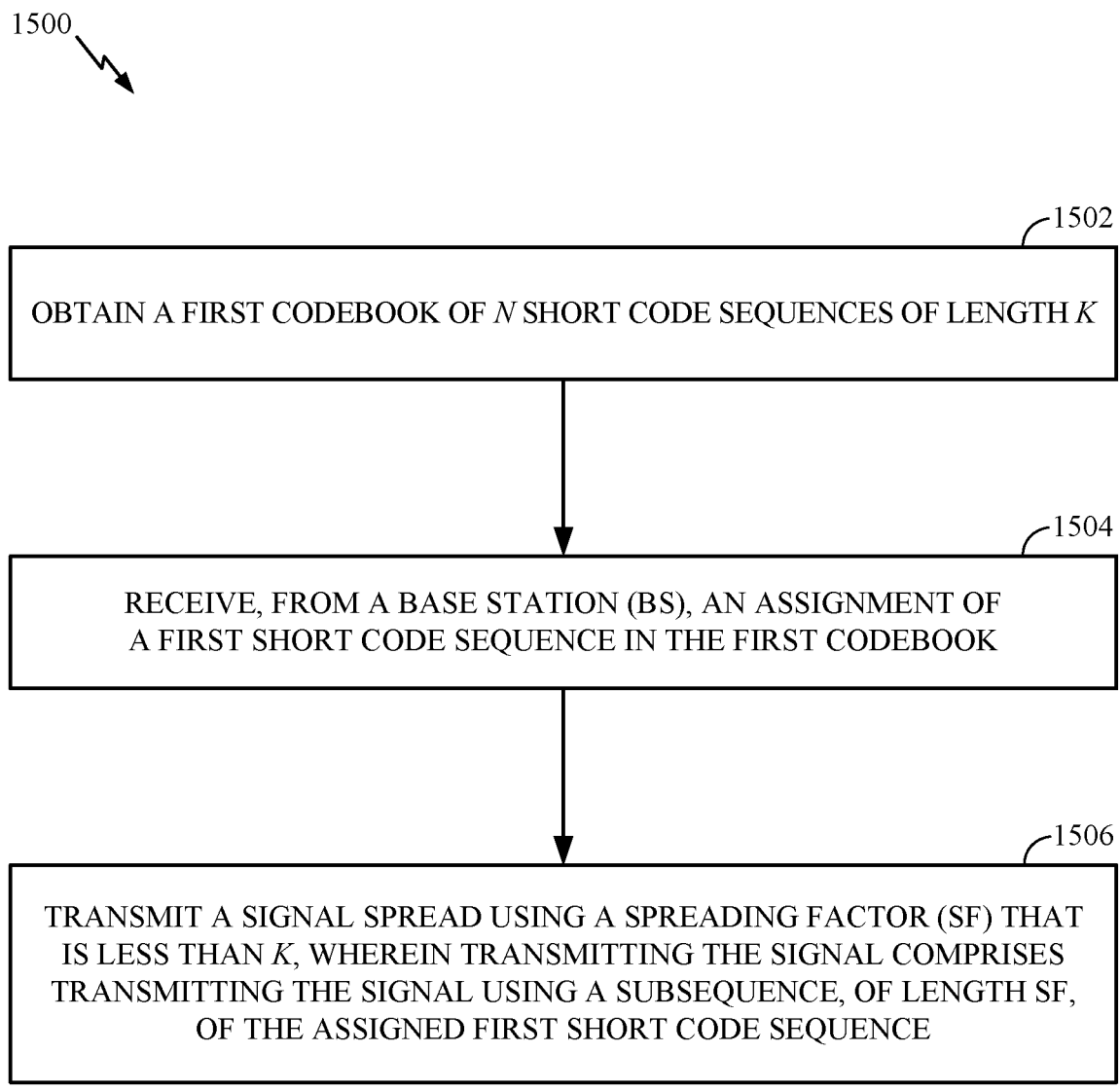
FIG. 15 illustrates example operations for wireless communications that may be performed by a user equipment, in accordance with aspects of the present disclosure.

FIG. 15 illustrates example operations 1500 for wireless communications that may be performed by a user equipment (e.g., UE 120a-1 in FIG. 1) in accordance with aspects of the present disclosure. Operations 1500 may be considered complementary to operations 1400, shown in FIG. 14 above.

Operations 1500 begin, at block 1502, by the UE obtaining a first codebook of N short code sequences of length K. For example, UE 120a-1 (shown in FIG. 1) obtains a first codebook (e.g., by receiving the codebook from BS 110a or by reading from the memory of the UE) of N (e.g., 9) short code sequences of length K (e.g., 8).

At block 1504, operations 1500 continue with the UE receiving, from a base station (BS), an assignment of a first short code sequence in the first codebook. Continuing the example from above, UE 120a-1 receives, from BS 110a-1 (shown in FIG. 1), an assignment of a first short code sequence in the first codebook (i.e., the first codebook obtained in block 1502).

At 1506, operations 1500 continue with the UE transmitting a signal spread using a spreading factor (SF) that is less than K, wherein transmitting the signal comprises transmitting the signal using a subsequence, of length SF, of the assigned first short code sequence. Continuing the example from above, UE 120a-1 transmits a signal spread using an SF (e.g., 4) that is less that K (e.g., 8), wherein transmitting the signal comprises transmitting the signal using a subsequence, of length SF (e.g., 4), of the assigned first short code sequence (i.e., the short code sequence assigned in block 1504).

Figure 16:
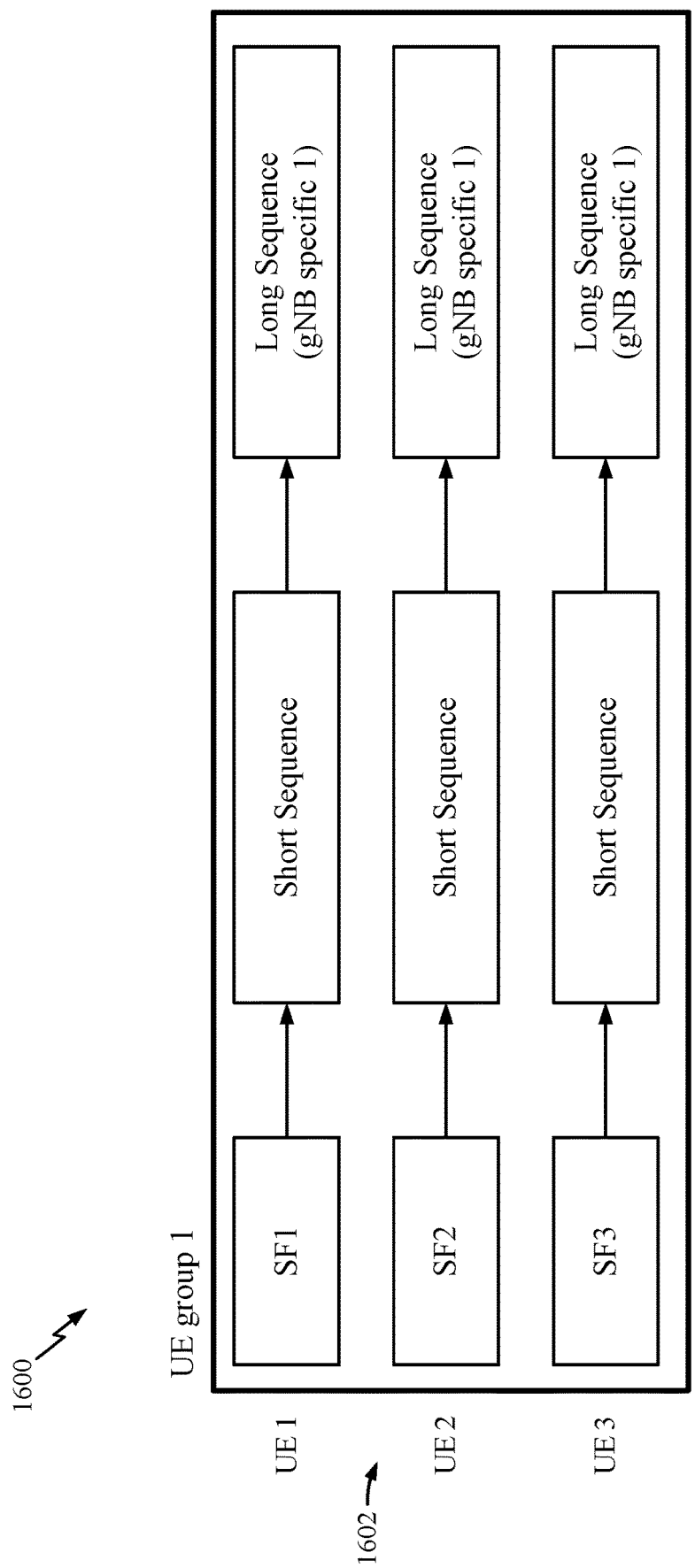
FIG. 16 is a schematic diagram illustrating an RSMA NOMA scheme, according to aspects of the present disclosure.

FIG. 16 is a schematic diagram 1600 illustrating an RSMA NOMA scheme, according to aspects of the present disclosure. In the scheme, three UEs (e.g., UEs 120a-1, 120a-2, and 120a-3, shown in FIG. 1) that transmit using different spreading factors SF1, SF2, and SF3 are grouped in a group 1602. Transmissions from each UE may be distinguished from transmissions by every other UE by a different short sequence. A BS (e.g., BS 110a, shown in FIG. 1) receiving the transmissions may perform the operations 1400 illustrated in FIG. 14. Similarly, the three UEs may perform operations 1500 illustrated in FIG. 15.

According to aspects of the present disclosure, a codebook of short spreading codes may be designed (e.g., selected or calculated) for (N, K) (where N=(total number of UEs) and K=spreading factor) to have a reduced cross-correlation when compared with other short spreading codes. Such a codebook may be referred to as a cross-correlation optimized short spreading codes codebook. Such a codebook may comprise a set of N sequences, each with length K.

In aspects of the present disclosure, a codebook of short spreading codes may be calculated according to the below algorithm:

$$(\forall \, N > K \geq 2),$$

$$s_n^A(k) \triangleq \frac{1}{\sqrt{K}} \exp\left(j\pi\left(r\frac{(k+n+\theta)^2}{N}\right)\right);$$

where
each sequence has length K, and k is an index of the element within the sequence, such that $1 \leq k \leq K$;
N is the number of sequences, and n is an index of the sequence in the set of sequences, such that $1 \leq n \leq N$;
θ and r are arbitrarily selected parameters that satisfy $-N \leq \theta < N$, and $1 \leq r < 2N$.

Additionally or alternatively, a codebook of short spreading codes may be calculated according to the below algorithm:

$$(\forall \, N > K \geq 2)$$

$$s_n^B(k) \triangleq \frac{1}{\sqrt{K}} \exp\left(j\pi\left(r\frac{(k+n+\theta)(k+n+\theta+1)}{N}\right)\right);$$

where
each sequence has length K, and k is an index of the element within the sequence, such that $1 \leq k \leq K$;
N is the number of sequences, and n is an index of the sequence in the set of sequences, such that $1 \leq n \leq N$;
θ and r are arbitrarily selected parameters that satisfy $-N \leq \theta < N$, and $1 \leq r < 2N$.

In both of the above algorithms, θ and r may be selected to reduce cross-correlation of the sequences produced.

According to aspects of the present disclosure, cross-correlation optimized short spreading codes can be used to enable transmissions using variable spreading factors via a fixed number of layers. That is, multiple transmissions by differing devices may be scheduled during a period, and the devices may use differing spreading factors and the disclosed short spreading codes. A device receiving the transmissions may successfully receive and decode all of the transmissions based on the disclosed short spreading codes.

Figure 17:
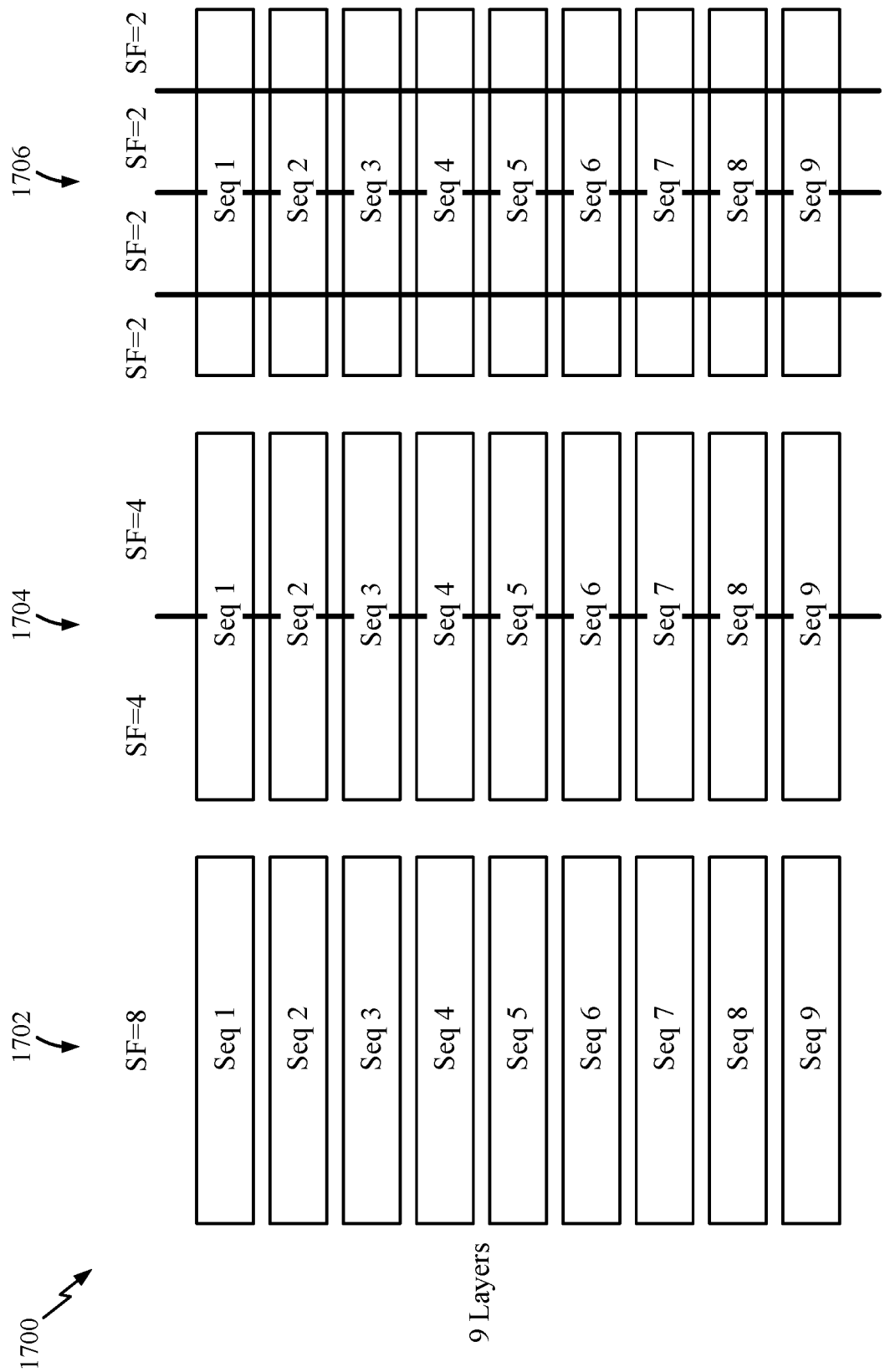
FIG. 17 illustrates an exemplary scheme for using short code sequences and subsequences, according to aspects of the present disclosure.

FIG. 17 illustrates an exemplary scheme 1700 for using short code sequences and subsequences, according to aspects of the present disclosure. In the exemplary scheme, N=9. As illustrated at 1702, a first codebook is generated for (N, K)=(9, 8). Two codebooks for (N, K)=(9, 4) are shown at 1704. Four codebooks for (N, K)=(9, 2) are shown at 1706. The sequences in each of the codebooks with shorter length are subsequences of the sequences in the codebooks with longer length. That is, subsequences of the SF=8 codebook are also cross-correlation optimized sequences for smaller SF. The subsequences also satisfy the previous formulas (i.e., the algorithms shown above) with different values of θ. Use of cross-correlation optimized short spreading codes as variable spreading factor codes are illustrated in FIGS. 18-20, described below.

Figure 18:
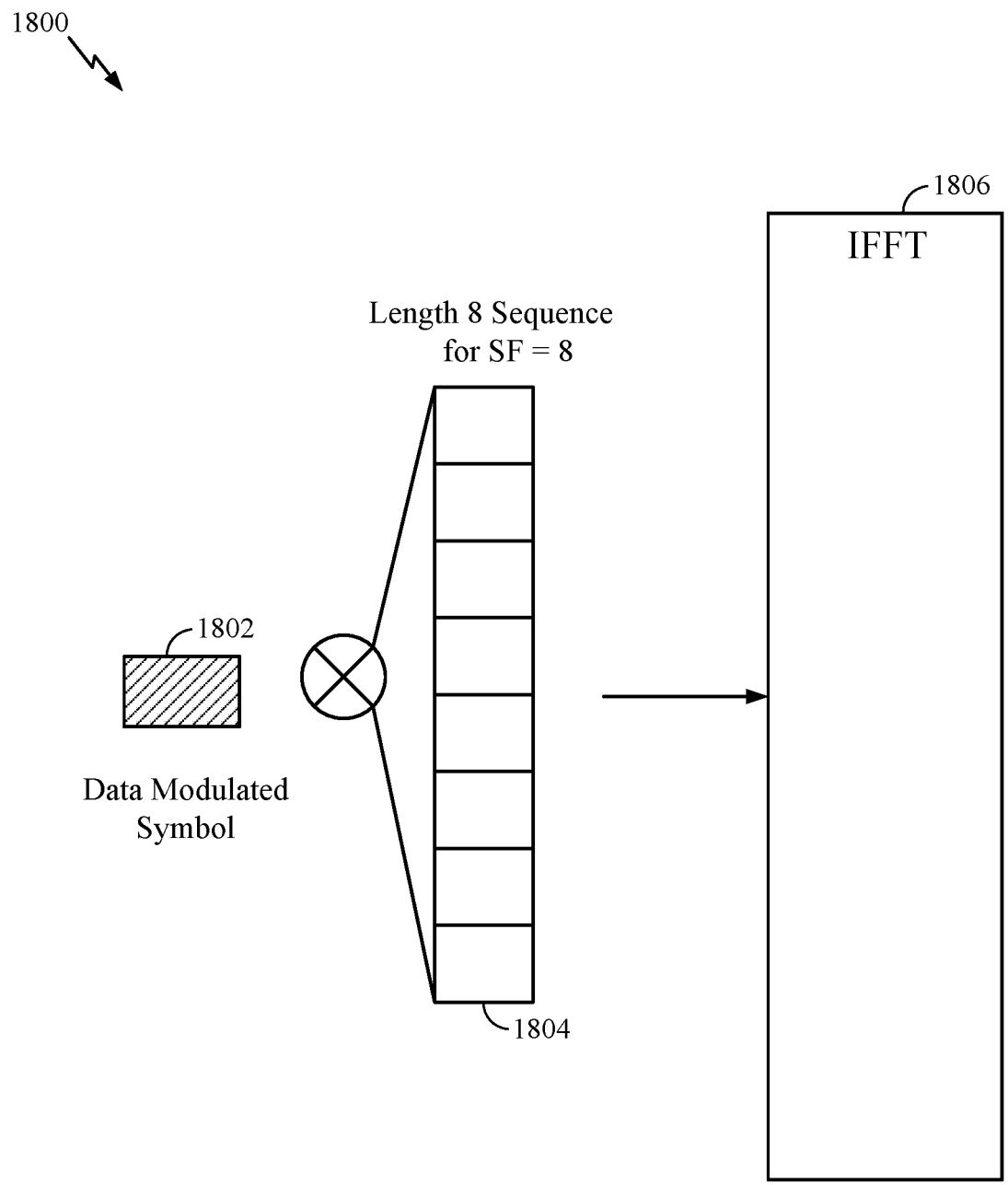
FIG. 18 illustrates use of cross-correlation optimized short spreading codes, in accordance with aspects of the present disclosure.

FIG. 18 is a diagram 1800 illustrating use of cross-correlation optimized short spreading codes for a transmission with SF=8, according to aspects of the present disclosure. A data modulated symbol 1802 is spread with a short spreading sequence 1804 for SF=8 and fed into an inverse fast Fourier transform (IFFT) 1806 prior to transmission as a waveform (e.g., a CP-OFDM or a DFT-s-OFDM waveform).

Figure 19:
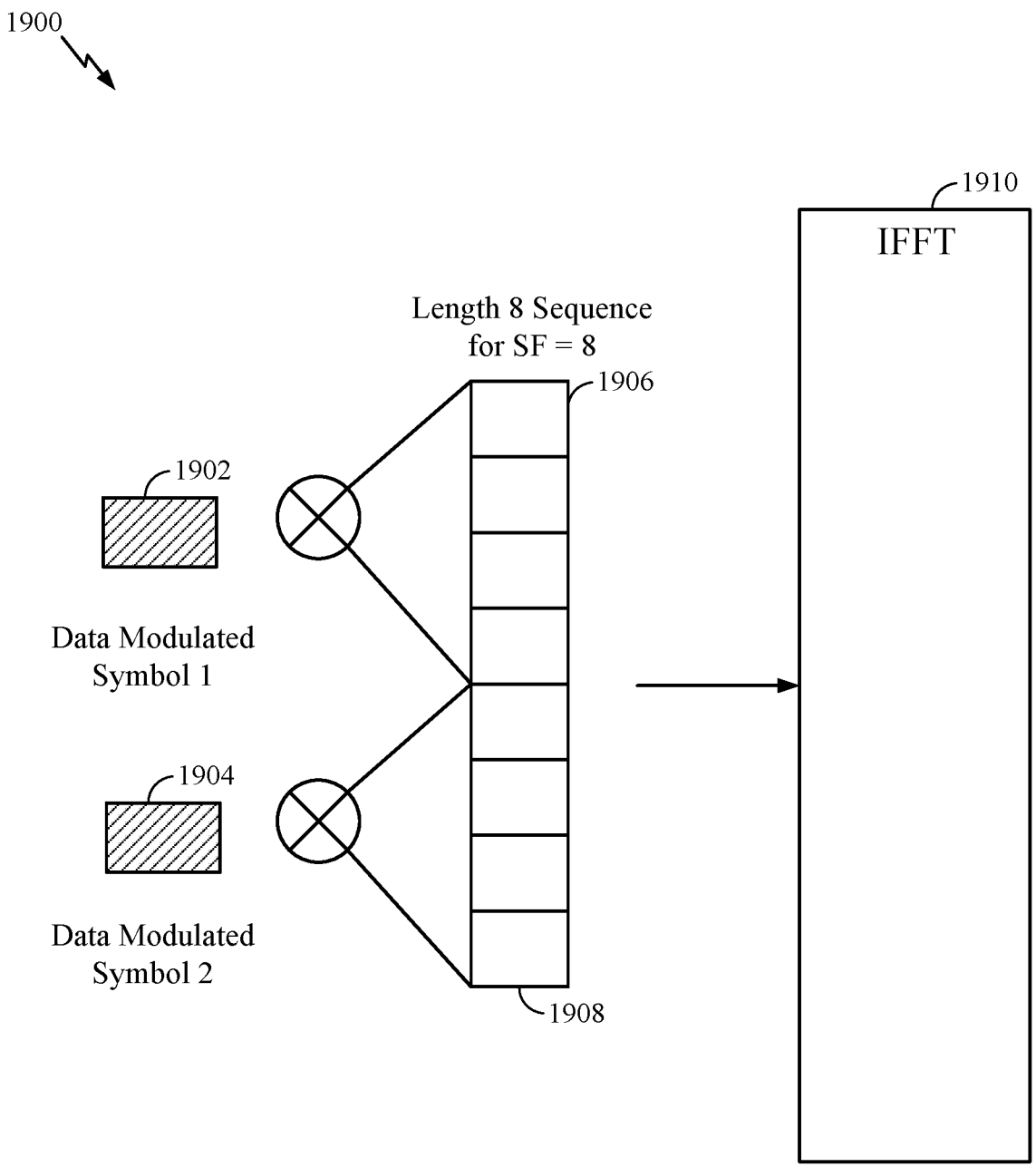
FIG. 19 illustrates use of cross-correlation optimized short spreading codes, in accordance with aspects of the present disclosure.

FIG. 19 is a diagram 1900 illustrating use of cross-correlation optimized short spreading codes for a transmission with SF=4, according to aspects of the present disclosure. Two data modulated symbols 1902 and 1904 are spread with subsequences 1906 and 1908 of the sequence for SF=8 (i.e., the sequence 1804 in FIG. 18) and fed into an IFFT 1910 prior to transmission as a waveform (e.g., a CP-OFDM or a DFT-s-OFDM waveform).

Figure 20:
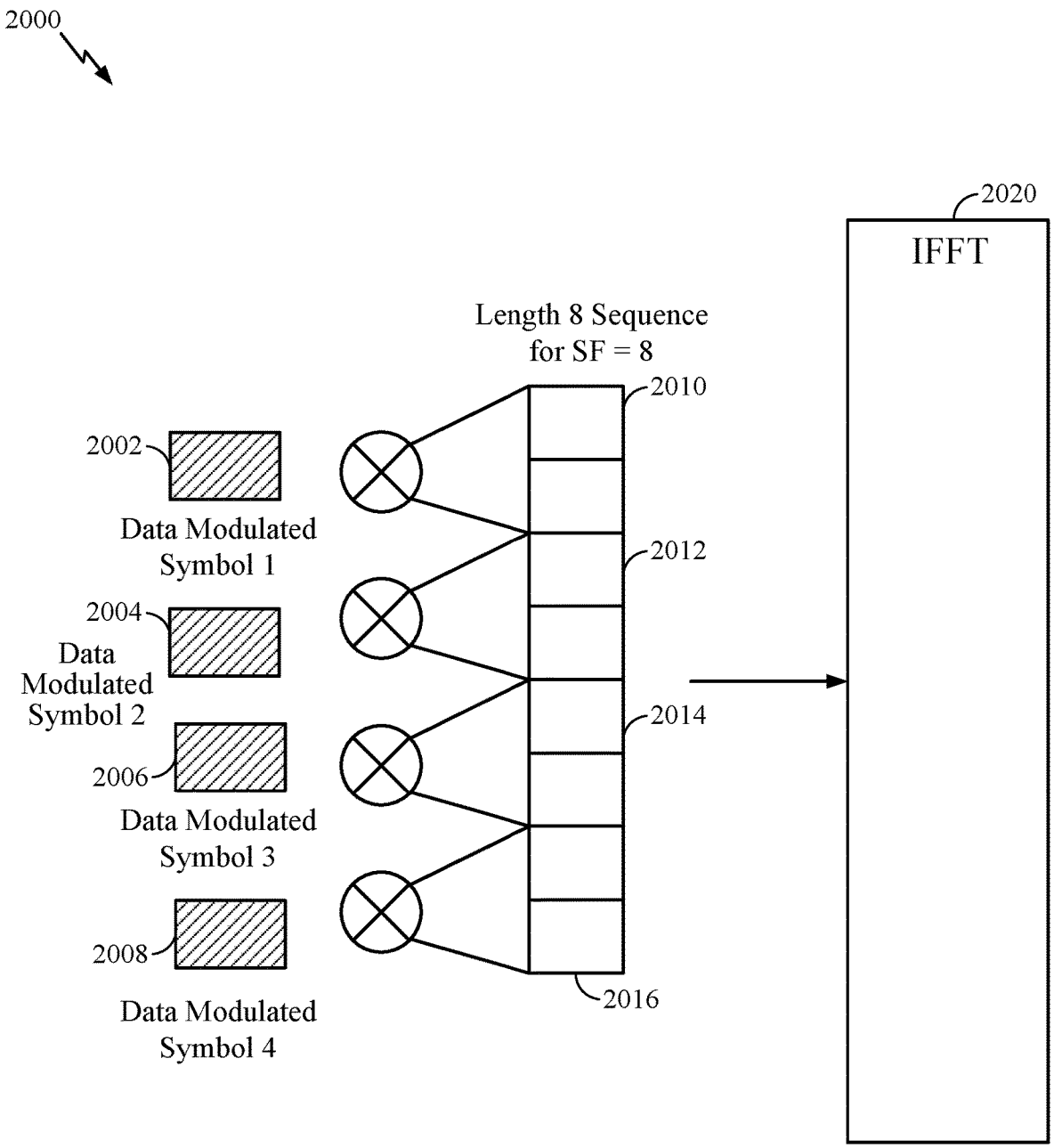
FIG. 20 illustrates use of cross-correlation optimized short spreading codes, in accordance with aspects of the present disclosure.

FIG. 20 illustrates use of cross-correlation optimized short spreading codes for a transmission with SF=2, according to aspects of the present disclosure. Four data modulated symbols 2002, 2004, 2006, and 2008 are spread with subsequences 2010, 2012, 2104, and 2016 of the sequence for SF=8 (i.e., the sequence 1804 in FIG. 18) and fed into an IFFT 2020 prior to transmission as a waveform (e.g., a CP-OFDM or a DFT-s-OFDM waveform).

According to aspects of the present disclosure, UEs transmitting using different SFs may be multiplexed in one set of frequency and time resources using short spreading codes.

In aspects of the present disclosure, short sequence assignments (e.g., to transmitting UEs) may be tone-location-dependent to align the short sequences with different UEs transmitting using different SFs.

Figure 21:
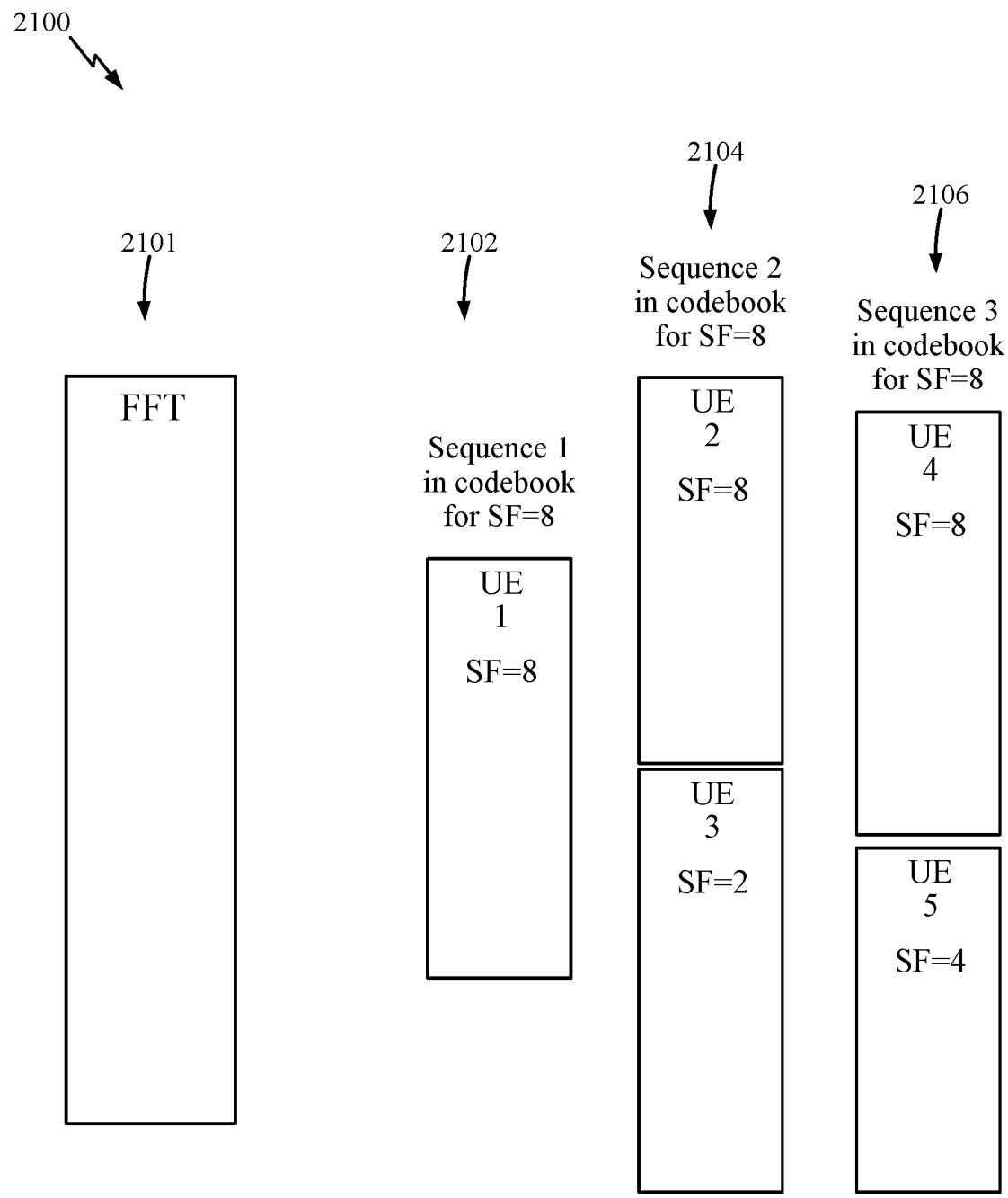
FIG. 21 illustrates use of cross-correlation optimized short spreading codes, in accordance with aspects of the present disclosure.

FIG. 21 is an exemplary technique 2100 for uplink receiving, by use of cross-correlation optimized short spreading codes and successive interference cancellation, signals from UEs using different SFs that are multiplexed in one set of transmission resources, according to aspects of the present disclosure. At 2101, a received signal is processed by a fast Fourier transform to generate a set of superimposed symbols with different SF. At 2102, a symbol transmitted by a first UE using sequence 1 in a codebook with SF=8 is detected by a receiver (e.g., a receiver in BS 110, shown in FIG. 1). At 2104, the receiver may cancel the symbol transmitted by the first UE (i.e., using successive cancellation), and then the receiver detects a symbol transmitted by a second UE using sequence 2 in the codebook with SF=8 and a symbol transmitted by a third UE using a subsequence with SF=2 of a sequence in the codebook. At 2106, the receiver may cancel the symbols transmitted by the second UE and the third UE, and then the receiver detects a symbol transmitted by a fourth UE using sequence 3 in the codebook with SF=8 and a symbol transmitted by a fifth UE using a subsequence with SF=4 of a sequence in the codebook.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Moreover, the term "or" is intended to mean an inclusive "or" rather than an exclusive "or." That is, unless specified otherwise, or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. As used herein, reference to an element in the singular is not intended to mean "one and only one" unless specifically so stated, but rather "one or more." For example, the articles "a" and "an" as used in this application and the appended claims should generally be construed to mean "one or more" unless specified otherwise or clear from the context to be directed to a singular form. Unless specifically stated otherwise, the term "some" refers to one or more. A phrase referring to "at least one of" a list of items refers to any combination of those items, including single members.

As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting and/or means for receiving may comprise one or more of a transmit processor 420, a TX MIMO processor 430, a receive processor 438, or antenna(s) 434 of the base station 110 and/or the transmit processor 464, a TX MIMO processor 466, a receive processor 458, or antenna(s) 452 of the user equipment 120. Additionally, means for obtaining, means for designating, means for aggregating, means for collecting, means for selecting, means for switching, and means for detecting may comprise one or more processors, such as the controller/processor 480, transmit processor 464, receive processor 458, and/or MIMO processor 466 of the user equipment 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, phase change memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of wireless communications performed by a base station (BS), comprising:
assigning, from a first codebook of N short code sequences of length K, a subset of the short code sequences to a number of user equipments (UEs), wherein the number is at least two and at most N;
receiving a signal including uplink data or control signals from two or more of the UEs, wherein:
a first uplink data or control signal is sent using a first subsequence of one of the assigned subset of short code sequences, and
a second uplink data or control signal, different from the first uplink data or control signal, is sent using a second subsequence of one of the assigned subset of short code sequences or using one of the assigned subset of short code sequences; and
decoding each uplink data or control signal in the signal based on the assigned subset of the short code sequences and subsequences of the short code sequences in the assigned subset of the short code sequences.

2. The method of claim 1, wherein the first codebook of N short code sequences is designed to meet a criterion for low cross correlation across the short code sequences in the first codebook.

3. The method of claim 2, wherein:
each of the N short code sequences comprises X short code subsequences of length K/X; and
a second codebook of sequences, comprising each short code subsequence of the N short code sequences, is designed to meet the criterion for low cross correlation across the sequences in the second codebook.

4. The method of claim 1, wherein:
the first uplink data or control signal is sent using a first spreading factor (SF) equal to a length of the first subsequence; and
the second uplink data or control signal is sent using a second SF equal to a length of the second subsequence or the short code sequence used in sending the second uplink data or control signal.

5. The method of claim 1, wherein decoding the first uplink data or control signal comprises:
despreading the signal using the first subsequence; and
wherein decoding the second uplink data or control signal comprises:
canceling the first uplink data or control signal from the signal to generate a new signal, and
despreading the new signal using the second subsequence.

6. The method of claim 1, wherein each short code sequence, s, of the N short code sequences, is generated according to a formula:

$$s_n(k) = \frac{1}{\sqrt{K}} \exp\left(j\pi\left(r\frac{(k+n+\theta)^2}{N}\right)\right),$$

where:
k is an index of an element within the short code sequence, such that $1 \leq k \leq K$,
n is an index of the short code sequence in the N short code sequences, such that $1 \leq n \leq N$,
$-N \leq \theta < N$, and
$1 \leq r < 2N$.

7. The method of claim 1, wherein each short code sequence, s, of the N short code sequences, is generated according to a formula:

$$s_n^B(k) \triangleq \frac{1}{\sqrt{K}} \exp\left( j\pi\left( r \frac{(k+n+\theta)(k+n+\theta+1)}{N} \right) \right),$$

where:
- k is an index of an element within the short code sequence, such that $1 \leq k \leq K$,
- n is an index of the short code sequence in the N short code sequences, such that $1 \leq n \leq N$,
- $-N \leq \theta < N$, and
- $1 \leq r < 2N$.

8. A method of wireless communications performed by a user equipment (UE), comprising:
- obtaining a first codebook of N short code sequences of length K;
- receiving, from a base station (BS), an assignment of a first short code sequence in the first codebook; and
- transmitting a signal spread using a spreading factor (SF) that is less than K, wherein transmitting the signal comprises transmitting the signal using a subsequence, of length SF, of the assigned first short code sequence.

9. The method of claim 8, further comprising:
receiving an indication of the SF from the BS.

10. The method of claim 9, wherein receiving the indication comprises:
receiving an identifier of a group to which the UE is assigned, wherein UEs of the group transmit using the SF.

11. The method of claim 8, further comprising:
determining, based on a measurement of a downlink signal from the BS, the SF.

12. The method of claim 8, wherein transmitting the signal comprises transmitting the signal on a set of tones, and the method further comprises:
determining the subsequence based on the set of tones.

13. The method of claim 8, wherein each short code sequence, s, of the N short code sequences, is generated according to a formula:

$$s_n(k) = \frac{1}{\sqrt{K}} \exp\left( j\pi\left( r \frac{(k+n+\theta)^2}{N} \right) \right),$$

where:
- k is an index of an element within the short code sequence, such that $1 \leq k \leq K$,
- n is an index of the short code sequence in the N short code sequences, such that $1 \leq n \leq N$,
- $-N \leq \theta < N$, and
- $1 \leq r < 2N$.

14. The method of claim 8, wherein each short code sequence, s, of the N short code sequences, is generated according to a formula:

$$s_n^B(k) \triangleq \frac{1}{\sqrt{K}} \exp\left( j\pi\left( r \frac{(k+n+\theta)(k+n+\theta+1)}{N} \right) \right),$$

where:
- k is an index of an element within the short code sequence, such that $1 \leq k \leq K$,
- n is an index of the short code sequence in the N short code sequences, such that $1 \leq n \leq N$,
- $-N \leq \theta < N$, and
- $1 \leq r < 2N$.

15. An apparatus for wireless communications, comprising:
a processor configured to:
- assign, from a first codebook of N short code sequences of length K, a subset of the short code sequences to a number of user equipments (UEs), wherein the number is at least two and at most N;
- receive a signal including uplink data or control signals from two or more of the UEs, wherein:
  - a first uplink data or control signal is sent using a first subsequence of one of the assigned subset of short code sequences, and
  - a second uplink data or control signal, different from the first uplink data or control signal, is sent using a second subsequence of one of the assigned subset of short code sequences or using one of the assigned subset of short code sequences; and
- decode each uplink data or control signal in the signal based on the assigned subset of the short code sequences and subsequences of the short code sequences in the assigned subset of the short code sequences; and
a memory coupled with the processor.

16. The apparatus of claim 15, wherein the first codebook of N short code sequences is designed to meet a criterion for low cross correlation across the short code sequences in the first codebook.

17. The apparatus of claim 16, wherein:
- each of the N short code sequences comprises X short code subsequences of length K/X; and
- a second codebook of sequences, comprising each short code subsequence of the N short code sequences, is designed to meet the criterion for low cross correlation across the sequences in the second codebook.

18. The apparatus of claim 15, wherein:
- the first uplink data or control signal is sent using a first spreading factor (SF) equal to a length of the first subsequence; and
- the second uplink data or control signal is sent using a second SF equal to a length of the second subsequence or the short code sequence used in sending the second uplink data or control signal.

19. The apparatus of claim 15, wherein the processor is configured to decode the first uplink data or control signal by:
despreading the signal using the first subsequence; and
wherein the processor is configured to decode the second uplink data or control signal by:
- canceling the first uplink data or control signal from the signal to generate a new signal, and
- despreading the new signal using the second subsequence.

20. The apparatus of claim 15, wherein each short code sequence, s, of the N short code sequences, is generated according to a formula:

$$s_n(k) = \frac{1}{\sqrt{K}} \exp\left( j\pi\left( r \frac{(k+n+\theta)^2}{N} \right) \right),$$

where:
 k is an index of an element within the short code sequence, such that 1≤k≤K,
 n is an index of the short code sequence in the N short code sequences, such that 1≤n≤N,
 −N≤θ<N, and
 1≤r<2N.

21. The apparatus of claim 15, wherein each short code sequence, s, of the N short code sequences, is generated according to a formula:

$$s_n^B(k) \triangleq \frac{1}{\sqrt{K}}\exp\left(j\pi\left(r\frac{(k+n+\theta)(k+n+\theta+1)}{N}\right)\right),$$

where:
 k is an index of an element within the short code sequence, such that 1≤k≤K,
 n is an index of the short code sequence in the N short code sequences, such that 1≤n≤N,
 −N≤θ<N, and
 1≤r<2N.

22. An apparatus for wireless communications, comprising:
 a processor configured to:
  obtain a first codebook of N short code sequences of length K;
  receive, from a base station (BS), an assignment of a first short code sequence in the first codebook; and
  transmit a signal spread using a spreading factor (SF) that is less than K, wherein transmitting the signal comprises transmitting the signal using a subsequence, of length SF, of the assigned first short code sequence; and
 a memory coupled with the processor.

23. The apparatus of claim 22, wherein the processor is further configured to:
 receive an indication of the SF from the BS.

24. The apparatus of claim 23, wherein the processor is configured to receive the indication by:
 receiving an identifier of a group to which the apparatus is assigned, wherein user equipments (UEs) of the group transmit using the SF.

25. The apparatus of claim 22, wherein the processor is further configured to:
 determine, based on a measurement of a downlink signal from the BS, the SF.

26. The apparatus of claim 22, wherein the processor is configured to transmit the signal by transmitting the signal on a set of tones, and the processor is further configured to:
 determine the subsequence based on the set of tones.

27. The apparatus of claim 22, wherein each short code sequence, s, of the N short code sequences, is generated according to a formula:

$$s_n(k) = \frac{1}{\sqrt{K}}\exp\left(j\pi\left(r\frac{(k+n+\theta)^2}{N}\right)\right),$$

where:
 k is an index of an element within the short code sequence, such that 1≤k≤K,
 n is an index of the short code sequence in the N short code sequences, such that 1≤n≤N,
 −N≤θ≤N, and
 1≤r<2N.

28. The apparatus of claim 22, wherein each short code sequence, s, of the N short code sequences, is generated according to a formula:

$$s_n^B(k) \triangleq \frac{1}{\sqrt{K}}\exp\left(j\pi\left(r\frac{(k+n+\theta)(k+n+\theta+1)}{N}\right)\right),$$

where:
 k is an index of an element within the short code sequence, such that 1≤k≤K,
 n is an index of the short code sequence in the N short code sequences, such that 1≤n≤N,
 −N≤θ≤N, and
 1≤r<2N.

* * * * *